United States Patent
Urakami et al.

(10) Patent No.: US 8,936,682 B2
(45) Date of Patent: Jan. 20, 2015

(54) METHOD OF MANUFACTURING HOMOGENEOUS SILICON CARBIDE SINGLE CRYSTAL WITH LOW POTENTIAL OF GENERATING DEFECTS

(75) Inventors: Yasushi Urakami, Obu (JP); Itaru Gunjishima, Aichi-gun (JP); Ayumu Adachi, Toyota (JP)

(73) Assignee: DENSO CORPORATION, Kariya (JP)

( * ) Notice: Subject to any disclaimer, the term of this patent is extended or adjusted under 35 U.S.C. 154(b) by 746 days.

(21) Appl. No.: 13/210,513

(22) Filed: Aug. 16, 2011

(65) Prior Publication Data
US 2012/0060751 A1    Mar. 15, 2012

(30) Foreign Application Priority Data
Aug. 26, 2010   (JP) ................. 2010-190102

(51) Int. Cl.
| | | |
|---|---|---|
| C30B 23/02 | (2006.01) | |
| C30B 29/36 | (2006.01) | |
| C30B 23/00 | (2006.01) | |
| H01L 29/16 | (2006.01) | |

(52) U.S. Cl.
CPC ............ C30B 29/36 (2013.01); C30B 23/002 (2013.01); H01L 29/1608 (2013.01); C30B 23/00 (2013.01)
USPC ................ 117/106; 117/84; 117/88; 117/101

(58) Field of Classification Search
CPC ...... C30B 23/00; C30B 23/02; C30B 23/025; C30B 25/00; C30B 25/02; C30B 25/18; C30B 25/20
USPC .............. 117/84, 88, 101, 106, 902, 937, 951
See application file for complete search history.

(56) References Cited

U.S. PATENT DOCUMENTS

| | | |
|---|---|---|
| 5,958,132 A | 9/1999 | Takahashi et al. |
| 7,135,074 B2 | 11/2006 | Gunjishima et al. |
| 2003/0070611 A1 | 4/2003 | Nakamura et al. |

FOREIGN PATENT DOCUMENTS

| | | |
|---|---|---|
| JP | A-08-143396 | 6/1996 |
| JP | A-10-45499 | 2/1998 |
| JP | A-2006-52097 | 2/2006 |
| JP | 2006225232 A * | 8/2006 |
| JP | A-2006-225232 | 8/2006 |

* cited by examiner

*Primary Examiner* — Mikhail Kornakov
*Assistant Examiner* — Kenneth A Bratland, Jr.
(74) *Attorney, Agent, or Firm* — Posz Law Group, PLC

(57) ABSTRACT

A manufacturing method of a SiC single crystal includes growing a SiC single crystal on a surface of a SiC seed crystal, which satisfies following conditions: (i) the SiC seed crystal includes a main growth surface composed of a plurality of sub-growth surfaces; (ii) among directions from an uppermost portion of a {0001} plane on the main growth surface to portions on a periphery of the main growth surface, the SiC seed crystal has a main direction in which a plurality of sub-growth surfaces is arranged; and (iii) an offset angle $\theta_k$ of a k-th sub-growth surface and an offset angle $\theta_{k+1}$ of a (k+1)-th sub-growth surface satisfy a relationship of $\theta_k < \theta_{k+1}$.

18 Claims, 13 Drawing Sheets

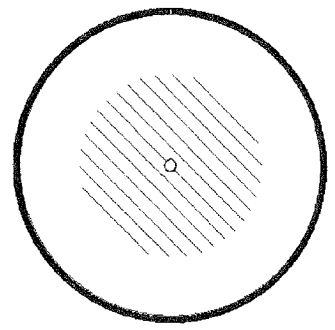
FIG. 13A   FIG. 13B   FIG. 13C   FIG. 13D
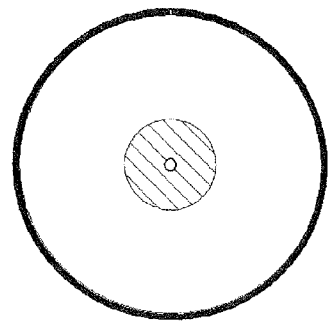
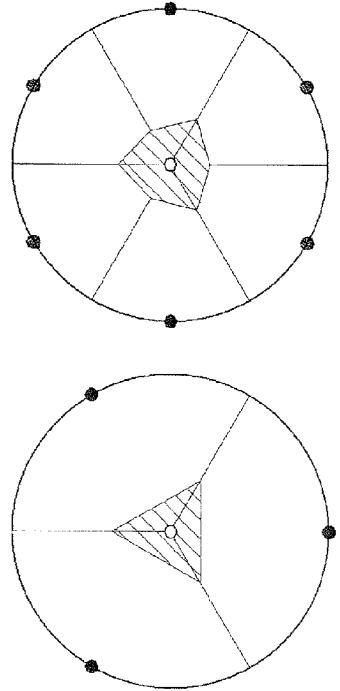
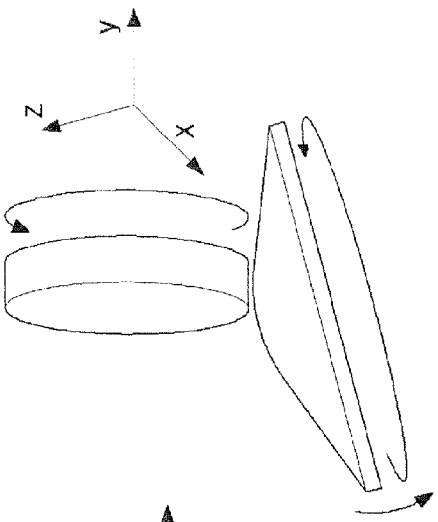
FIG. 13E
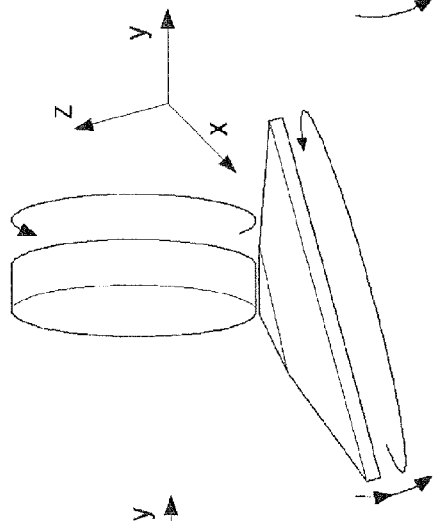
FIG. 13F
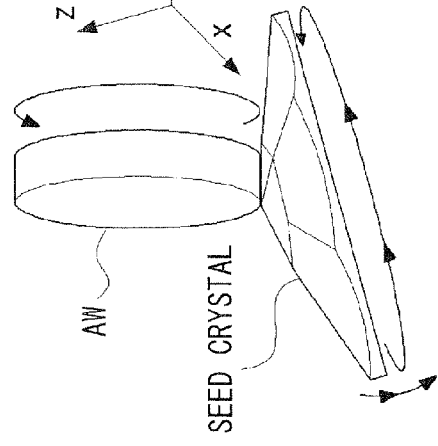
FIG. 13G

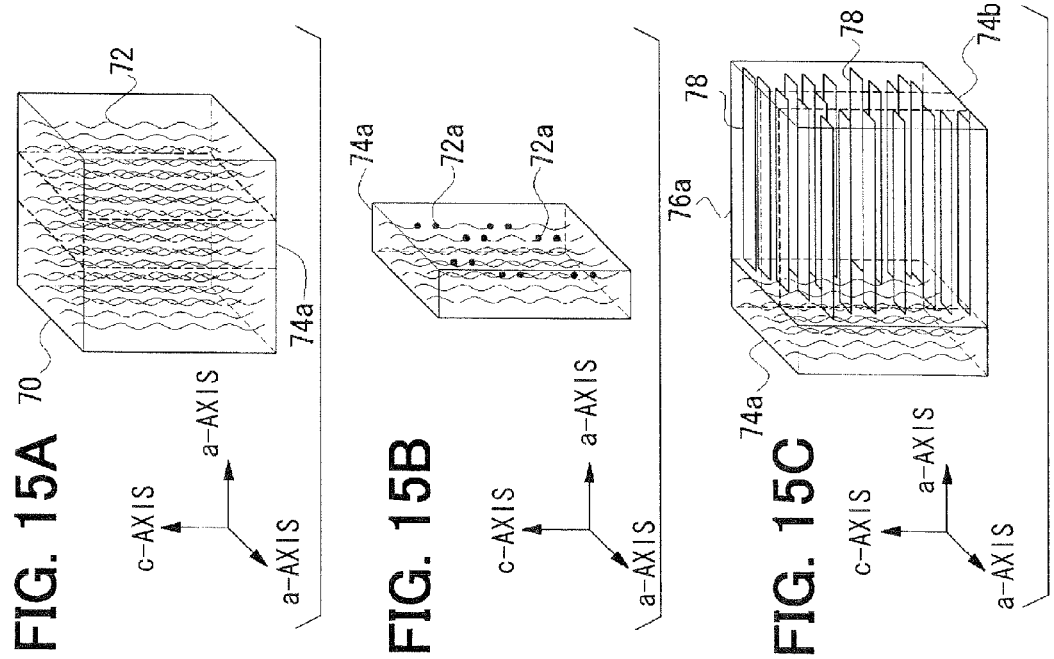

METHOD OF MANUFACTURING HOMOGENEOUS SILICON CARBIDE SINGLE CRYSTAL WITH LOW POTENTIAL OF GENERATING DEFECTS

CROSS REFERENCE TO RELATED APPLICATION

This application is based on Japanese Patent Application No. 2010-190102 filed on Aug. 26, 2010, the disclosure of which is incorporated herein by reference.

TECHNICAL FIELD

The present invention relates to a manufacturing method of a silicon carbide single crystal.

BACKGROUND

Silicon carbide (SiC) includes high-temperature SiC (alpha-SiC) that has a hexagonal crystal structure and low-temperature SiC (beta-SiC) that has a cubic crystal structure. Compared with Si, SiC has a higher thermostability, and also has a wider bandgap, which contributes to a high electric breakdown field intensity. Therefore, a semiconductor device formed of a SiC single crystal is expected as a candidate material of a next generation power device to replace a semiconductor device formed of Si. Specifically, the alpha-SiC is attractive for a semiconductor material of an ultra-low power loss device because the alpha-SiC has a wider bandgap than the beta-SiC.

The alpha-SiC has a {0001} plane, a {1-100} plane and a {11-20} plane, which are perpendicular to the {0001} plane, as main crystal planes. Hereafter, the {0001} plane is also referred to as a c-plane, and the {1-100} plane and the {11-20} plane are also referred to as a-planes generically. A c-plane growth method is known as a manufacturing method of the alpha-SiC single crystal. In the c-plane growth method, a SiC single crystal in which the c-plane or a plane whose offset angle from the c-plane is within a predetermined range is exposed as a growth surface is used as a seed crystal, and a SiC single crystal is grown on the growth surface by a method such as a sublimation recrystallization method.

However, the single crystal manufactured by the c-plane growth method has great amount of defects including defects such as micropipe defects (pipe-like void having a diameter of several μm to 100 μm) generated in a direction parallel to a <0001> direction and c-axis threading screw dislocations.

To manufacture a SiC power device having a high performance, a leakage current generated in a SiC semiconductor should be reduced. It is considered that an increase in the leakage current is caused by the micropipe defects and threading screw dislocations generated in the SiC single crystal.

Various conventional methods are disclosed to inhibit above-described defects such as the micropipe defects and the threading screw dislocations.

For example, JP-A-05-262599 (corresponding to U.S. Pat. No. 5,958,132, hereafter referred to as patent document No. 1) discloses a growth method of the SiC single crystal. In this growth method (hereafter referred to as an a-plane growth method), a seed crystal in which a plane (for example, the {1-100} plane or the {11-20} plane) inclined at an angle within approximately 60° to 120° from the c-plane is exposed as a growth surface is used to grow the SiC single crystal.

Further, the patent document No. 1 discloses:
(1) when SiC is grown on a crystal plane inclined at an angle within approximately 60° to 120° from the c-plane, atom stacking arrangement is shown on the crystal plane surface, and therefore, a crystal having the same polytype with the seed crystal is easily grown;
(2) the threading screw dislocations are not generated by this growth method; and
(3) in a case where the seed crystal includes a dislocation having a slip plane on the c-plane, the dislocation will be transferred to the growing crystal.

JP-A-08-143396 (hereafter referred to as patent document No. 2) discloses another growth method of a SiC single crystal. In this growth method, SiC is grown on a seed crystal having a {10-10} plane as the growth surface, and then a {0001} wafer is cut out from the grown single crystal. New SiC is grown using the {0001} wafer as a new seed crystal.

Further, the patent document No. 2 discloses:
(1) a SiC single crystal grown by this method has small amount of micropipe defects; and
(2) a sufficiently large {0001} wafer, which is larger than a wafer obtained from a Acheson crystal, can be obtained so that a bulk crystal can be easily grown using the {0001} wafer as a seed crystal by this method.

JP-A-2003-119097 (corresponding to US 2003/0070611, hereafter referred to as patent document No. 3) discloses another growth method of a SiC single crystal. In this growth method, the a-plane growth is performed multiple times in a mutually perpendicular direction, and then the c-plane growth is performed at the end.

Further, the patent document No. 3 discloses:
(1) dislocation density in the growing crystal is reduced exponentially with an increasing number of a-plane growth times;
(2) stacking faults are inevitably generated during the a-plane growth; and
(3) the SiC single crystal grown in this method has no micropipe defects or threading screw dislocations, and has little stacking faults because of the c-plane growth, which is performed at the end.

JP-A-2004-323348 (corresponding to U.S. Pat. No. 7,135,074, hereafter referred to as patent document No. 4) discloses another growth method of a SiC single crystal. In this growth method, a dislocation control seed crystal is used to grow SIC. The dislocation control seed crystal has a growth surface, which has an offset angle of within 60° from the {0001} plane, and a region capable of generating the threading screw dislocations is formed on the growth surface.

Further, the patent document No. 4 discloses the threading screw dislocations can be generated with certainty in a region formed by c-plane facets during the c-plane growth. Therefore, a generation of heterogeneous polymorphous crystals and different surface orientation crystals can be inhibited.

JP-A-2006-225232 (hereafter referred to as patent document No. 5) discloses another growth method of a SiC single crystal. This growth method includes a growth step in which a seed crystal used for growing a silicon carbide single crystal and having a growth surface inclined at an angle of 20° or greater and less than 90° from the {0001} plane is cut out and a silicon carbide single crystal ingot is grown using the cut-out seed crystal, and the growth step is repeated for n times. On the {0001} plane, an angle difference between an inclined direction of a growth surface used in an n-th growth step and an inclined direction of a growth surface used in an (n−1)-th growth step is 45° or greater and 135° or less.

Further, the patent document No. 5 discloses:
(1) micropipe defects and treading dislocations are not generated or converted to basal surface stacking faults or basal surface dislocations by using a plane inclined at an angle of 20° or greater and less than 90° from the {0001} plane as a growth surface; and
(2) the amount of transferred basal surface dislocations from the seed crystal to the growing crystal is extremely reduced by rotating an inclined direction of a growth surface on the {0001} plane.

The a-plane growth method has an advantage of growing a SiC single crystal having a low density of threading screw dislocations. However, in the SiC single crystal grown by the a-plane growth method, stacking faults are easily generated in a direction approximately parallel to the c-plane at a high density. When stacking faults are generated in the SIC single crystal, an electric resistance in a direction that traverses the stacking faults will increase. Therefore, the SiC single crystal having stacking faults at a high density can not be used as a semiconductor material for power devices.

It is considered that a SiC single crystal, which has little threading screw dislocations and little stacking faults, can be manufactured by performing the a-plane growth at least one time followed by the c-plane growth. However, a seed crystal manufactured from a crystal grown by the a-plane growth has little threading screw dislocations. Therefore, the seed crystal has no step providing source, which transfers polymorphism of the seed crystal to the growing crystal, in a c-lane facet, which is formed on a surface of the growing crystal during the c-plane growth. Accordingly, the heterogeneous polymorphous crystals and the different surface orientation crystals may be generated partially on the c-plane facet. Further, new threading screw dislocations may be randomly generated in the growing crystal with a growth of the heterogeneous polymorphous crystals and the different surface orientation crystals.

Regarding the problem described above, the patent document No. 4 discloses a growth method in which the dislocation control seed crystal, which has the region capable of generating the threading screw dislocations, is used to grow the SiC single crystal from a beginning of the growth to inhibit the generation of the heterogeneous polymorphous crystals and the different surface orientation crystals.

However, as shown in FIG. 17, when a threading screw dislocation generation region (TSDGR) is formed on a surface of the seed crystal, a part of the threading screw dislocations (TSD) may convert to basal surface (c-plane) threading edge dislocations (TED), and the threading edge dislocations (TED) may leak to a high-quality region. A part of the leaked threading edge dislocations (TED) in the high-quality region may convert to new threading screw dislocation (TSD). That is, the leaked threading edge dislocations (TED) cause a reduction in quality of the high-quality region.

SUMMARY

In view of the foregoing problems, it is an object of the present invention to provide a manufacturing method of a SiC single crystal that is homogeneously grown with a low potential of generating defects.

According to a first aspect of the present disclosure, a manufacturing method of a SiC single crystal includes growing a SiC single crystal on a surface of a SiC seed crystal. The SiC seed crystal satisfies following conditions: (i) the SiC seed crystal includes a main growth surface composed of a plurality of sub-growth surfaces, and the main growth surface is an exposed surface of the SiC single crystal whose normal vector has a component in a crucible central axis raw material direction; (ii) among directions from an uppermost portion of a {0001} plane on the main growth surface to portions on a periphery of the main growth surface, the SiC seed crystal has a main direction in which a plurality of sub-growth surfaces is arranged; and (iii) in a case where the sub-growth surfaces located from the uppermost portion of the {0001} plane to the periphery in the main direction are defined in order as a first sub-growth surface, a second sub-growth surface, . . . an n-th sub-growth surface (n≥2), an offset angle $\theta_k$ of a k-th sub-growth surface (1≤k≤n−1) and an offset angle $\theta_{k+1}$ of a (k+1)-th sub-growth surface satisfy a relationship of $\theta_k < \theta_{k+1}$.

In the above-described manufacturing method, the SiC single crystal that is homogeneously grown with a low potential of generating defects, can be manufactured.

BRIEF DESCRIPTION OF THE DRAWINGS

The above and other objects, features and advantages of the present invention will become more apparent from the following detailed description made with reference to the accompanying drawings. In the drawings:

FIG. 13A to FIG. 13D are bottom views of various main growth surfaces of seed crystals according to a eleventh embodiment, and FIG. 13E to FIG. 13G are diagrams showing examples of processing methods of the main growth surfaces;

FIG. 15A to FIG. 15G are diagrams showing a manufacturing method of SiC single crystal by repeated a-plane growth method and the c-plane growth method;

DETAILED DESCRIPTION

Embodiments of the present disclosure will be described.

1. Definition of Terms

Typically, a sublimation recrystallization method, a high-temperature solution deposition method and a CVD method are used to grow a SiC single crystal. In the present disclosure, any one of the growth methods can be used. Specifically, the sublimation recrystallization method is favorable when a seed crystal is used to grow a SiC single crystal. The "sublimation recrystallization method" is a growth method in which the seed crystal is disposed at a low-temperature side, and SiC gas, which is sublimated in a high-temperature portion, is deposited on a surface of the seed crystal. Terms used hereafter are defined with respect to the sublimation recrystallization method. However, the present disclosure can also be applied in another growth method (for example, the CVD method) other than the sublimation recrystallization method.

In the sublimation recrystallization method, a SiC seed crystal 12 is disposed at one end portion of a crucible 14, and raw material 16 of SiC is disposed at the other end portion of the crucible 14. The seed crystal 12 is fixed to one end portion of the crucible 14 via a seed crystal pedestal 18. In an example of the SIC seed crystal shown in FIG. 1, the SiC seed crystal 12 is disposed at a top end of the crucible 14. Alternatively, the SiC seed crystal 12 and the raw material 16 may be disposed reversely. By sublimating the raw material 16 on the above-described state, new crystal can be grown on a surface of the SiC seed crystal 12.

1.1. Main Growth Surface

Figure 1:
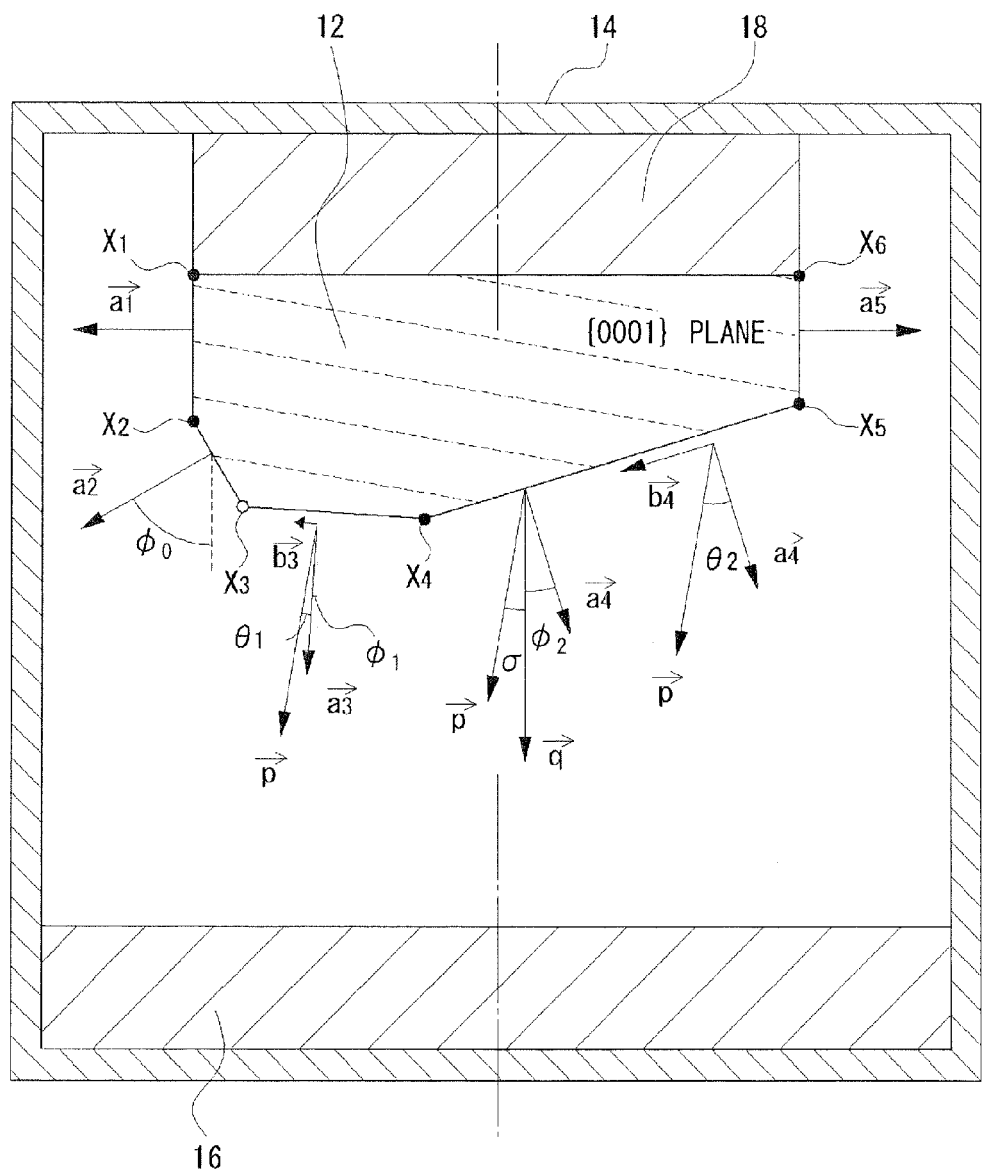
FIG. 1 is a diagram showing a sublimation recrystallization method.

A "main growth surface" is an exposed plane of the SiC seed crystal 12, and has a normal vector having a component in a crucible central axis raw material direction (hereafter referred to as a central axis direction). As shown in FIG. 1, the "central axis direction" is a direction from the SiC seed crystal 12 to the raw material 16, and is parallel to a central axis of the crucible 14. That is, the "central axis direction" shows a macro growth direction of the SiC single crystal. Typically, the "central axis direction" is perpendicular to a bottom surface of the SiC seed crystal 12 or a bottom surface of the seed crystal pedestal 18 to which the seed crystal 12 is fixed.

In the example of the SiC seed crystal shown in FIG. 1, the SiC seed crystal 12 has six surfaces including a surface $X_1X_2$, a surface $X_2X_3$, a surface $X_3X_4$, a surface $X_4X_5$, a surface $X_5X_6$ and a surface $X_6X_1$. Except the surface $X_6X_1$, which is in contact with the seed crystal pedestal 18, other surfaces are exposed to an atmosphere in the crucible 14.

Vectors $a_1$ to $a_5$ are normal vectors of the surfaces $X_1X_2$ to $X_5X_6$ respectively. A Vector p is a normal vector of the {0001} plane of the SiC seed crystal 12. A Vector q is parallel to the central axis direction.

In the example of the SiC seed crystal shown in FIG. 1, the surface $X_1X_2$ and the surface $X_5X_6$ respectively have normal vectors $a_1$ and $a_5$, which are perpendicular to the vector q and have no components in the central axis direction. Thus, the main growth surface is composed of the surface $X_2X_3$, the surface $X_3X_4$ and the surface $X_4X_5$ in the SiC seed crystal 12 shown in FIG. 1.

1.2. Sub-Growth Surface

A "sub-growth surface" is an individual surface that composes the main growth surface. A sub-growth surface can have a planar shape or a curved shape. If the main growth surface is composed of a finite number of straight lines (plane surfaces) when the SiC seed crystal 12 is seen in cross-section, the number of straight lines is referred to as a "number of sub-growth surfaces". In the example of the SIC seed crystal shown in FIG. 1, the main growth surface of the SiC seed crystal 12 is composed of three sub-growth surfaces including the surface $X_2X_3$, the surface $X_3X_4$ and the surface $X_4X_5$.

Alternatively, if the whole main growth surface or a portion of the main growth surface is composed of a curved line (curved planes) when the SiC seed crystal 12 is seen in cross-section, the curved portion is defined as an aggregate of infinite sub-growth surfaces composed of infinitesimal line elements (infinitesimal plane elements).

1.3. Offset Angle θ, Offset Direction

An "offset angle θ" is an angle between a normal vector a of a sub-growth surface and the normal vector p of the {0001} plane of the SiC seed crystal 12. In the example of the SiC seed crystal shown in FIG. 1, an angel $\theta_1$ and an angel $\theta_2$ are offset angles of the surface $X_3X_4$ and the surface $X_4X_5$ respectively. In the present disclosure, the offset angel $\theta_1$ is smaller than the offset angel $\theta_2$ as to be described below.

An "offset direction" is a direction of a vector b, which is a projected vector of the normal vector p of the {0001} plane on the sub-growth surface. In the example of the SiC seed crystal shown in FIG. 1, vectors $b_3$ and $b_4$ are generated by projecting the normal vector p of the {0001} plane on the sub-growth surfaces $X_3X_4$ and $X_4X_5$ respectively.

An "upstream side (upper side) in the offset direction" is a side to which the vector b points. A "downstream side (lower side) in the offset direction" is an opposite side to which the vector b points.

1.4. Inclined Angle ϕ of the Sub-Growth Surface

An "inclined angle ϕ of the sub-growth surface" is an angle between the vector q of the central axis direction and the normal vector a of the sub-growth surface. In the example of the SiC seed crystal shown in FIG. 1, angles $\phi_0$, $\phi_1$ and $\phi_2$ are the inclined angles of sub-growth surfaces $X_2X_3$, $X_3X_4$ and $X_4X_5$ respectively.

1.5. First Sub-Growth Surface to n-th Sub-Growth Surface

In the present disclosure, the main growth surface of the SiC seed crystal is composed of a plurality of sub-growth surfaces. The main growth surface of the SiC seed crystal has an uppermost portion $Y_1$ of the {0001} plane. Among directions from the uppermost portion $Y_1$ of the {0001} plane to portions on a periphery of the main growth surface, the SiC seed crystal has a plurality of sub-growth surfaces in one direction (main direction). The sub-growth surfaces in the main direction from the uppermost portion $Y_1$ of the {0001} plane to a portion on the periphery are defined in order as a first sub-growth surface $F_1$, a second sub-growth surface $F_2$, ... an n-th sub-growth surface $F_n$ (n≥2).

That is, the "first sub-growth surface $F_1$" is one of the sub-growth surfaces, which compose the main growth surface, and is (1) located at an uppermost portion $Y_1$ side of the {0001} plane, and (2) adjacent to the second sub-growth surface $F_2$, which satisfies an offset angle condition as to be described below.

The "uppermost portion $Y_1$ of the {0001} plane" is a {0001} plane located at a forefront end of the upstream side in the offset direction in the main growth surface.

For example, when a forefront end of the SIC seed crystal 12 is a polygonal surface composed of two planes or is a conical surface, the {0001} plane located at the forefront end is shown as a point seen in cross section, and the "uppermost portion $Y_1$ of the {0001} plane" is referred to the point.

The first sub-growth surface $F_1$ may be located at an end side of the main growth surface or at an inner side of the main growth surface.

A "lowermost portion $Y_2$ of the {0001} plane" is a {0001} plane located at a forefront end of the downstream side in the offset direction in the main growth surface. From a crystallographic point of view, the lowermost portion $Y_2$ of the {0001} plane is located at the most distant position from the uppermost portion $Y_1$ of the {0001} plane.

As shown in FIG. 1, it is preferable that the SiC seed crystal 12 is configured to have predetermined surfaces such as the surface $X_1X_2$ and the surface $X_5X_6$. Normal vectors of the predetermined surfaces have no components in the central axis direction, and an inclined angle $\phi$ of any one of the predetermined surfaces is 80° or greater. The widths of predetermined surfaces in the central axis direction are 1 mm or greater. In a case where the SiC seed crystal 12 has no above-described predetermined surfaces, a periphery portion of the seed crystal 12 fixed to the seed crystal pedestal 18 is so thin that crystal quality at a periphery portion of the growing crystal is degraded by a movement of micropipe defects in the growth direction. The micropipe defects are generated by locally-performed sublimation recrystallization at a rear surface of the seed crystal 12.

In the example of the SiC seed crystal shown in FIG. 1, a point $X_3$ is the uppermost portion $Y_1$ of the {0001} plane. Among directions from the point $X_3$ to portions on the periphery of the main growth surface, the SiC seed crystal 12 has a plurality of sub-growth surfaces including the surface $X_3X_4$ and the surface $X_4X_5$ in one direction (main direction) from the point $X_3$ to a point $X_5$ on the periphery. Among the sub-growth surfaces in the main direction, the sub-growth surface $X_3X_4$ includes the uppermost portion $Y_1$ of the {0001} plane. Therefore, the first sub-growth surface $F_1$ is the surface $X_3X_4$ in this case. Additionally, the second sub-growth surface $F_2$ is the surface $X_4X_5$, which is adjacent to the surface $X_3X_4$ in the direction from the uppermost portion $Y_1$ of the {0001} plane to the point $X_5$ on the periphery.

1.6. Inclined Angle σ of the {0001} Plane

An "inclined angle σ of the {0001} plane" is an angle between the vector q of the central axis direction and the normal vector p of the {0001} plane.

1.7. Projected Plane

Figure 2A:
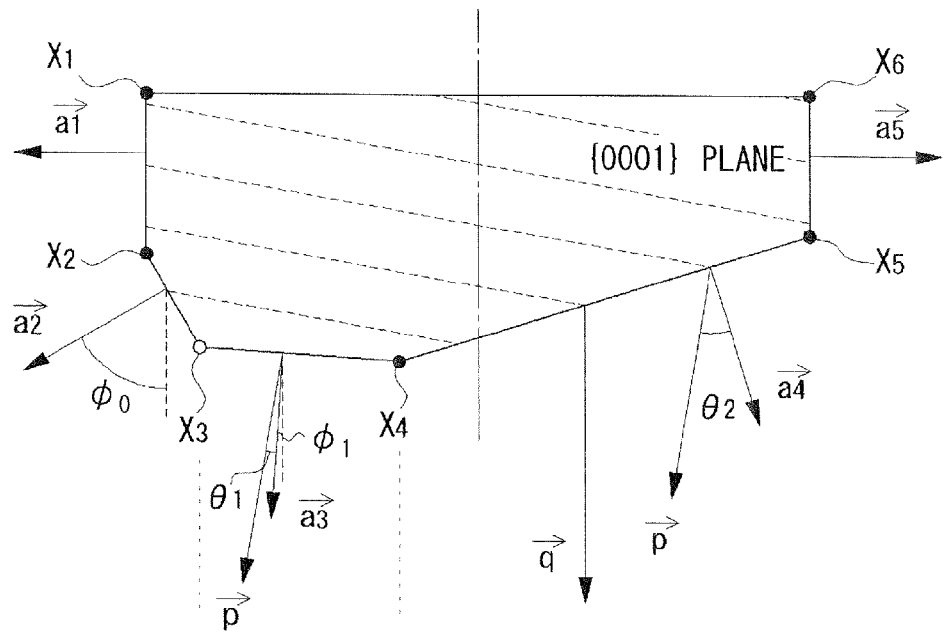
FIG. 2A is a cross-sectional view (taken from line IIA-IIA of FIG. 2B) of a SiC seed crystal.
Figure 2B:
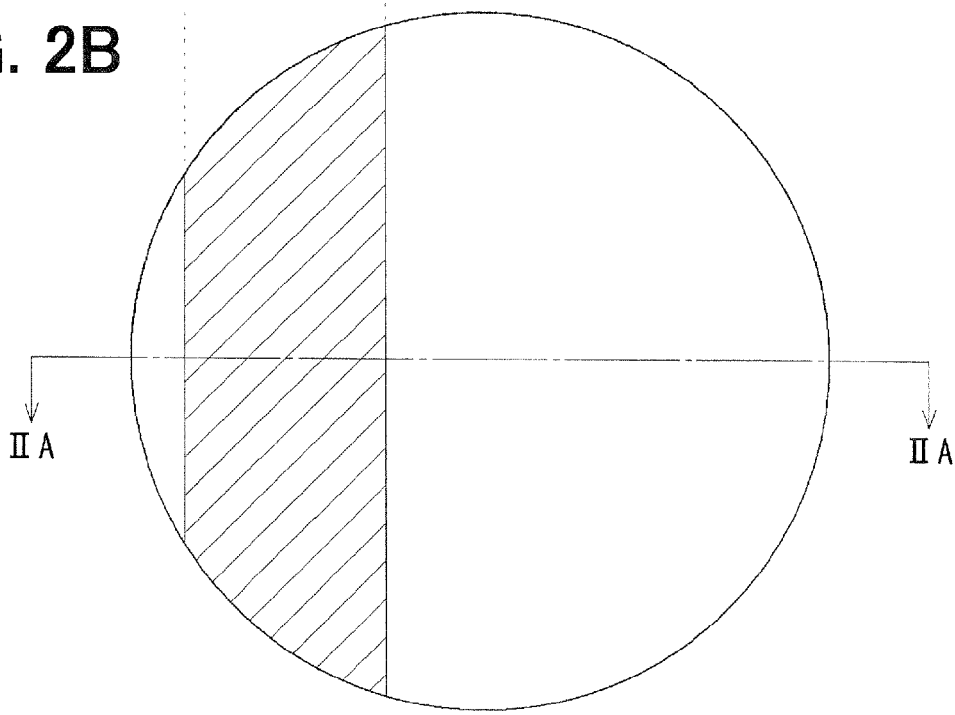
FIG. 2B is a bottom view of the SiC seed crystal.

A "projected plane" is a projected plane of the main growth surface or one of the sub-growth surfaces on a plane perpendicular to the central axis direction. A "projected area" is an area of the projected plane. In examples of SiC seed crystals shown in FIGS. 2A and 2B, the SiC seed crystal 12 has a disk-like shape. Therefore, the projected plane of the main growth surface is a circular plane. Further, from the bottom view, the main growth surface of the SiC seed crystal 12 is composed of three planes (sub-growth surfaces), and a projected plane of the surface $X_3X_4$ has an approximately trapezoidal shape (region shown with the hatching).

2. SiC Seed Crystal

In the present disclosure, a SiC seed crystal that satisfies at least the following conditions (i) to (iii) is used.

(i) The SiC seed crystal has a main growth surface composed of a plurality of sub-growth surfaces.

(ii) Among directions from the uppermost portion $Y_1$ of the {0001} plane on the main growth surface to portions on the periphery of the main growth surface, the SiC seed crystal has a direction (main direction) in which a plurality of sub-growth surfaces is arranged.

(iii) In a case where the sub-growth surfaces located from the uppermost portion $Y_1$ of the {0001} plane to the periphery in the main direction are defined in order as the first sub-growth surface $F_1$, the second sub-growth surface $F_2$, ... the n-th sub-growth surface $F_n$ (n≥2), an offset angle $\theta_k$ of the k-th sub-growth surface (1≤k≤n−1) and an offset angle $\theta_{k+1}$ of the (k+1)-th sub-growth surface satisfy a relationship of $\theta_k < \theta_{k+1}$.

2.1. Structure of Crystal

The alpha-SiC belongs to the hexagonal system, and has main crystal planes including the c-plane (the {0001} plane) and the a-planes (the {1-100} plane or the {11-20} plane) that are perpendicular to the c-plane. The c-plane can be stacked on another c-plane in three ways. Therefore, it is known that the alpha-SiC has infinite number of possible polytype crystal structures such as 2H, 4H or 6H. In the 2H structure, the c-planes are stacked in two layers in one period. In the 4H structure, the c-planes are stacked in four layers in one period. In the 6H structure, the c-planes are stacked in six layers in one period.

In the present disclosure, the SiC seed crystal is made of the alpha-SiC, and the alpha-SiC can have any polytype crystal structure without limitation.

2.2. Sub-Growth Surface

The main growth surface includes a plurality of sub-growth surfaces. The main growth surface may be composed of finite number of planar sub-growth surfaces. Alternatively, the main growth surface may be composed of a curved sub-growth surface (i.e. surface composed of infinitesimal plane elements) wholly or partially. It is preferable that the main growth surface is composed of finite number of plane sub-growth surfaces to simplify a seed crystal processing.

2.3. Offset Angle θ

In the present disclosure, among directions from the uppermost portion $Y_1$ of the {0001} plane to portions on the periphery of the main growth surface, the SiC seed crystal has a plurality of sub-growth surfaces in one direction (main direction). Further when the sub-growth surfaces in the main direction from the uppermost portion $Y_1$ of the {0001} plane to a portion on the periphery are defined in order as the first sub-growth surface $F_1$, the second sub-growth surface $F_2$, ... the n-th sub-growth surface $F_n$ (n≥2), an offset angle $\theta_k$ of the k-th sub-growth surface (1≤k≤n−1) is smaller than an offset angle $\theta_{k+1}$ of the (k+1)-th sub-growth surface.

The different part of the present disclosure from conventional arts is that the offset angle $\theta_1$ of the first sub-growth surface $F_1$ is the smallest, and the offset angle θ increases in the main direction from the uppermost portion $Y_1$ of the {0001} plane to the periphery of the main growth surface in a stepwise manner or continuously. It is preferable that each offset angle θ of the corresponding sub-growth surface is set to an appropriate value according to a density of the uppermost portion $Y_1$ of the {0001} plane and whether or not a threading screw dislocation generation region is formed.

Figure 18C:
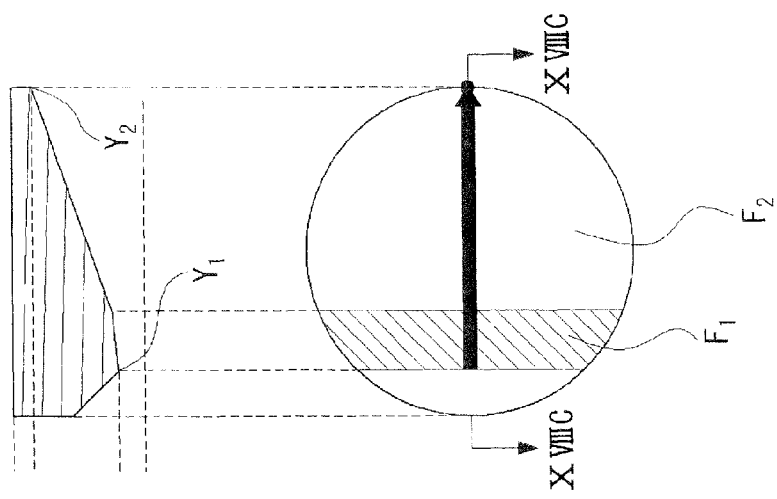
FIG. 18A to FIG. 18C are diagrams showing examples of main growth surfaces.
Figure 18B:
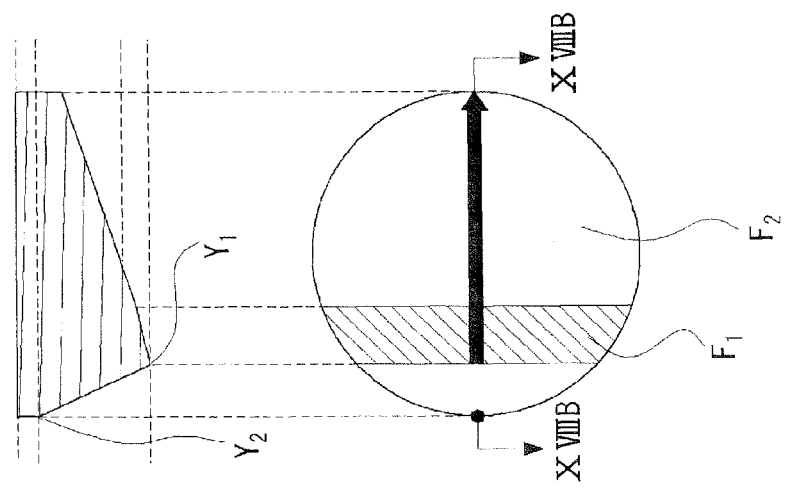
Figure 18A:
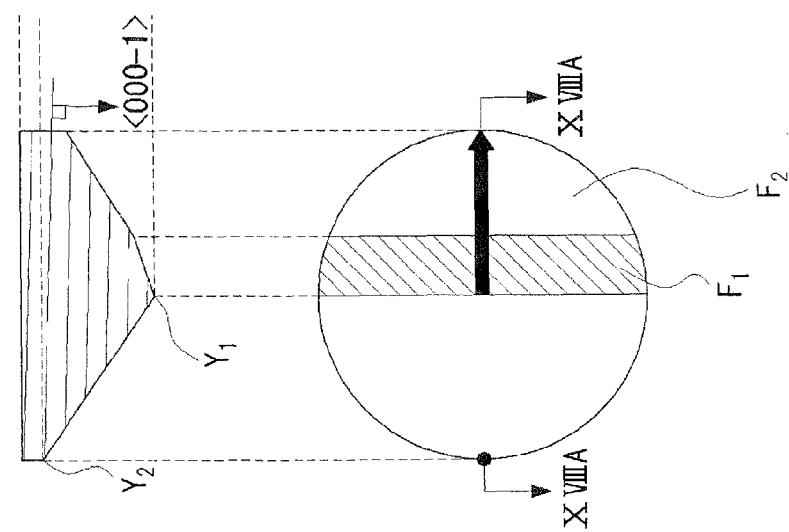

In FIG. 18A to FIG. 18C, bottom views of examples of main growth surfaces are shown in lower side drawings, and corresponding cross sectional views are shown respectively in upper side drawings.

In a seed crystal shown in FIG. 18A, the uppermost portion $Y_1$ of the {0001} plane is located in the vicinity of the center of the offset substrate. Further, among directions from the uppermost portion $Y_1$ of the {0001} plane to portions on the periphery of the main growth surface, the seed crystal has at least two sub-growth surfaces in one direction (main direction: shown by a black bold arrow in FIG. 18A). An end portion on the periphery side in the main direction is not the lowermost portion $Y_2$ of the {0001} plane. Among the sub-growth surfaces in the main direction, a sub-growth surface including the uppermost portion $Y_1$ of the {0001} plane is the first sub-growth surface $F_1$, and a sub-growth surface on the periphery side is the second sub-growth surface $F_2$. By using the seed crystal described in this example, a density of the uppermost portion $Y_1$ of the {0001} plane of a growing crystal, which is growing on the second sub-growth surface $F_2$, will be reduced and a movement of the stacking faults to the growing crystal, which is growing on the second sub-growth surface $F_2$, will be inhibited.

In a seed crystal shown in FIG. 18B, the uppermost portion $Y_1$ of the {0001} plane is located on the left side from the center of the offset substrate. The main direction (shown by a black bold arrow in FIG. 18B) is a direction in which the uppermost portion $Y_1$ of the {0001} plane is the most distant portion from the periphery of the main growth surface. An end portion on the periphery side in the main direction is not the lowermost portion $Y_2$ of the {0001} plane. Among the sub-growth surfaces in the main direction, a sub-growth surface including the uppermost portion $Y_1$ of the {0001} plane is the first sub-growth surface $F_1$, and a sub-growth surface on the periphery side is the second sub-growth surface $F_2$. By using the seed crystal described in this example, a high-quality region will be increased because an area of the second sub-growth surface $F_2$ is increased.

In a seed crystal shown in FIG. 18C, the uppermost portion $Y_1$ of the {0001} plane is located on the left side from the center of the offset substrate. The main direction (shown by a black bold arrow in FIG. 18C) is a direction from the uppermost portion $Y_1$ of the {0001} plane to the lowermost portion $Y_2$ of the {0001} plane. Among the sub-growth surfaces in the main direction, a sub-growth surface including the uppermost portion $Y_1$ of the {0001} plane is the first sub-growth surface $F_1$, and a sub-growth surface on the periphery side is the second sub-growth surface $F_2$. By using the seed crystal described in this example, a necessary thickness of the seed crystal will be reduced.

[2.3.1. Offset Angle $\theta_1$]

The first sub-growth surface $F_1$ and sub-growth surfaces in the vicinity provide the threading screw dislocations to a c-plane facet (c-plane at a forefront end of the growing crystal). The threading screw dislocations are generated in the uppermost portion $Y_1$ of the {0001} plane or in the threading screw dislocation generation region. The exposed threading screw dislocations on the first sub-growth surface $F_1$ easily convert to basal surface threading edge dislocations with an increasing offset angle $\theta_1$ of the first sub-growth surface $F_1$. As a result, the threading screw dislocations introduced in a region formed by the c-plane facets during the c-plane growth are not sufficient and may cause the generation of the heterogeneous polymorphous crystals and the different surface orientation crystals.

Further, the basal surface threading edge dislocations converted from the threading screw dislocations move to the downstream side in the offset direction. During the movement, a part of the threading edge dislocations may convert to the threading screw dislocations again. As a result, the threading screw dislocations may be introduced in the high-quality region of the growing crystal. Specifically, in a case where the threading screw dislocation generation region is formed in a seed crystal having a low density of the threading screw dislocations, a leak of the threading screw dislocations will increase the density of the threading screw dislocations in the high-quality region.

The offset angle $\theta_1$ needs to be set appropriately according to the density of the threading screw dislocations in the SiC seed crystal and whether or not the threading screw dislocation generation region is formed.

For example, it is preferable to set the offset angle $\theta_1$ to 20° or less in a case where the SiC seed crystal has a relatively high density of the threading screw dislocations. It is more preferable to set the offset angle $\theta_1$ to 15° or less, and is further more preferable to set the offset angle $\theta_1$ to 10° or less.

In contrast, in a case where the SiC seed crystal has a low density of the threading screw dislocations (for example, a seed crystal is cut from a single crystal grown by repeated a-plane growth), or in a case where the threading screw dislocation generation region is formed on the first sub-growth surface $F_1$ or on a surface region in the vicinity, it is preferable that a movement of the threading screw dislocations, which are generated in the first sub-growth surface $F_1$ or in the surface region in the vicinity, into the high-quality region is inhibited. Therefore, it is preferable to set the offset angle $\theta_1$ to 4° or less.

Figure 17:
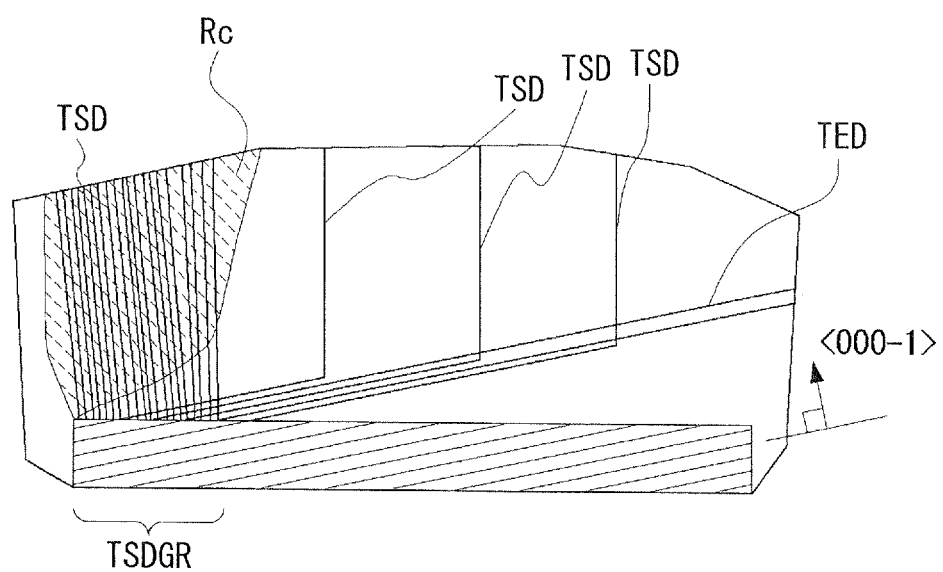
FIG. 17 is a cross-sectional view of a SiC single crystal to show a dislocation leakage from a threading screw dislocation generation region.

As shown in FIG. 17, in a case where the offset angle $\theta_1$ is set to 20° or greater, most of the threading screw dislocations (TSD) are converted to the basal surface threading edge dislocations (TED). As a result, the density of the threading screw dislocations (TSD) in the region ($R_c$) formed by the c-plane facets during the c-plane growth is reduced and the heterogeneous polymorphous crystals are easily generated. In a crystal having several thousands of the threading screw dislocations (TSD) per square centimeter, since some threading screw dislocations (TSD) are remained in the vicinity of the region ($R_c$) formed by the c-plane facets during the c-plane growth, the heterogeneous polymorphous crystals will not be generated even when the threading screw dislocations (TSD) disappear by a substantial proportion in the growing crystal. In contrast, in a crystal having several hundreds of the threading screw dislocations (TSD) per square centimeter, since the threading screw dislocations (TSD) remained in the vicinity of the region ($R_c$) formed by the c-plane facets during the c-plane growth are not enough to inhibit the generation of the heterogeneous polymorphous crystals, the heterogeneous polymorphous crystals are easily generated.

[2.3.2. Offset Angle $\theta_n$]

The n-th sub-growth surface $F_n$ and sub-growth surfaces in the vicinity convert the threading screw dislocations in the seed crystal to the basal surface threading edge dislocations, and remove the basal surface threading edge dislocations to an exterior of the growing crystal. The threading edge dislocations, which are converted from the exposed threading screw dislocations on the n-th sub-growth surface $F_n$, are removed easily to the exterior of the growing crystal with an increasing offset angle $\theta_n$ of the n-th sub-growth surface $F_n$.

However, when the offset angle $\theta_n$ is too large, a growth height of the growing crystal needs to be increased to remove the basal surface threading edge dislocations, which are converted from the threading screw dislocations, to the exterior of the growing crystal. As a result, stacking faults may be remained in the growing crystal at an increased probability.

The offset angle $\theta_n$ needs to be set appropriately according to the density of the threading screw dislocations in the SiC seed crystal and whether or not the threading screw dislocation generation region is formed.

For example, in a case where the SiC seed crystal has a relatively high density of the threading screw dislocations, it is preferable to set the offset angle $\theta_n$ to 20° or greater and 70° or less. It is more preferable to set the offset angle $\theta_n$ to 20° or greater and 50° or less.

In contrast, in a case where the SiC seed crystal has a relatively low density of the threading screw dislocations (for example, in a case where a seed crystal is cut from a single crystal grown by repeated the a-plane growth), it is preferable to set the offset angle $\theta_n$ to 4° or greater and 30° or less.

[2.3.3. Angle Difference $\Delta\theta_n$, $\Delta\theta_k$ Between Offset Angles]

As described above, the first sub-growth surface $F_1$ and sub-growth surfaces in the vicinity of the first sub-growth surface $F_1$ function differently from the n-th sub-growth surface $F_n$ and sub-growth surfaces in the vicinity of the n-th sub-growth surface $F_n$. Therefore, it is difficult to control a density distribution of the threading screw dislocations on the growth surface when an angle difference ($\Delta\theta_n=\theta_n-\theta_1$) between the offset angle $\theta_1$ of the first sub-growth surface $F_1$ and the offset angle $\theta_n$ of the n-th sub-growth surface $F_n$ is small. In order to obtain a high-quality crystal, it is preferable to set the angle difference $\Delta\theta_n$ to 2° or greater. It is more preferable to set the angle difference $\Delta\theta_n$ to 4° or greater.

However, when the angle difference $\Delta\theta_n$ is too large, a height difference on the growth surface is increased. Therefore, the grown crystal may not have a sufficient growth height. Accordingly, it is preferable to set the angle difference $\Delta\theta_n$ to 50° or less. It is more preferable to set the angle difference $\Delta\theta_n$ to 40° or less. Further, when an angle difference ($\Delta\theta_k=\theta_k-\theta_{k-1}$) between the offset angle $\theta_k$ of the k-th sub-growth surface and the offset angle $\theta_{k-1}$ of the (k-1)-th sub-growth surface is large, a subgrain boundary is easily generated. Therefore, it is preferable to set the angle difference $\Delta\theta_k$ to 30° or less.

It is preferable to set the offset angle $\theta_1$ and the angle difference $\Delta\theta_n$ to appropriate values according to the density of the threading screw dislocations in the SiC seed crystal.

For example, in a case where the density of the threading screw dislocations in the SiC seed crystal is equal to or greater than 1000/cm², it is preferable to set the offset angle $\theta_1$ and the angle difference $\Delta\theta_n$ to $\theta_1$=20°, $\Delta\theta_n$=+10° to 50°.

Additionally, in a case where the density of the threading screw dislocations in the SiC seed crystal is 100 to 1000/cm², it is preferable to set the offset angle $\theta_1$ and the angle difference $\Delta\theta_n$ to $\theta_1$=10 to 20°, $\Delta\theta_n$=+10 to 40°.

Additionally, in a case where the density of the threading screw dislocations in the SiC seed crystal is 10 to 100/cm², it is preferable to set the offset angle $\theta_1$ and the angle difference $\Delta\theta_n$ to $\theta_1$=4 to 8°, $\Delta\theta_n$=+4 to 30°.

Additionally, in a case where the density of the threading screw dislocations in the SiC seed crystal is 1 to 10/cm², it is preferable to set the offset angle $\theta_1$ and the angle difference $\Delta\theta_n$ to $\theta_1$=2° to 4°, $\Delta\theta_n$=+2° to 30°.

[2.3.4. Area Ratio in Low Offset Angle Region]

To generate the threading screw dislocations in the c-plane face with certainty, it is preferable that the first sub-growth surface $F_1$ and the sub-growth surfaces (low offset angle region) in the vicinity of the first sub-growth surface $F_1$ have low offset angles $\theta$.

In a low offset angle region, the threading screw dislocations are transferred directly to the growing crystal at a high probability. Therefore, the low offset angle region is preferable to have a small area in order to reduce the density of the threading screw dislocations in the growing crystal.

Specifically, it is preferable that a ratio ($=S_3\times100/S_1$) of a summation $S_3$ of areas of projected sub-growth surfaces, whose offset angles $\theta$ are 20° or less, to an the main growth surface area $S_1$ is set to 50% or less.

It is more preferable that a ratio ($=S_3\times100/S_1$) of a summation $S_3$ of areas of projected sub-growth surfaces, whose offset angles $\theta$ are 10° or less, to the main growth surface area $S_1$ is set to 50% or less.

It is further more preferable that a ratio ($=S_3\times100/S_1$) of a summation $S_3$ of areas of projected sub-growth surfaces, whose offset angles $\theta$ are 4° or less, to the main growth surface area $S_1$ is set to 50% or less.

2.4. Inclined Angle $\phi$ of the Sub-Growth Surface

The SiC seed crystal has a plurality of sub-growth surfaces. For example, in a case where the seed crystal is a cone-shaped onset substrate, a basic angle of the cone-shaped seed crystal increases when the inclined angle $\phi$ of the sub-growth surface is too large. As a result, an area (area of a basal surface of a cone-shaped seed crystal) of the {0001} plane substantially decreases in a cutting preparation process of the seed crystal. Additionally, a temperature difference between a forefront end part of the SiC seed crystal and the basal surface of the SiC seed crystal increases when the inclined angle $\phi$ of the sub-growth surface is too large. In the sublimation recrystallization method, recrystallization is preferentially performed at a part having a large temperature difference. Therefore, the crystal grown on the seed crystal can not have a sufficient growth height, because the crystal grows preferentially in a lateral direction when the inclined angle $\phi$ of the sub-growth surface is too large.

To acquire a sufficient growth height, it is preferable that a ratio ($=S_2\times100/S_1$) of a summation ($S_2$) of areas of projected sub-growth surfaces, whose offset angles $\theta$ are 30° or less, to the main growth surface area $S_1$ is set to 50% or greater.

2.5. Inclined Angle $\sigma$ of the {0001} Plane

Typically, the threading screw dislocations in the SiC seed crystal convert to the basal surface threading edge dislocations at a higher conversion probability with an increasing inclined angle σ of the {0001} plane. However, the growing crystal needs a higher growth height to remove the basal surface threading edge dislocations, which are converted from the threading screw dislocations, to the exterior of the growing crystal with the increasing inclined angle σ of the {0001} plane. Further, new stacking faults are easily generated in the growing crystal at a portion, which locates crystallographically upper side of the uppermost portion of the {0001} plane. Therefore, it is preferable to set the inclined angle σ of the {0001} plane to 30° or less.

2.6. Density of the Threading Screw Dislocations

The density of the treading screw dislocations of the SiC seed crystal depends on the single crystal from which the seed crystal is cut. Typically, in a case where a seed crystal is cut from a single crystal grown by the c-plane growth method, the seed crystal has a relatively high density of the threading screw dislocations. The density of the threading screw dislocations in this kind of seed crystal is usually $1000/cm^2$ or greater.

In a case where a seed crystal is cut from a single crystal (grown by the a-plane growth method), which is grown on a seed crystal having an offset angle of 60° to 90°, the seed crystal has little threading screw dislocations.

In the present disclosure, the density of the threading screw dislocations can have any value for purpose without limitation. However, it is preferable to set the offset angle θ, the inclined angle φ of the sub-growth surface, the inclined angle σ of the {0001} plane and an area ratio of the threading screw dislocation generation region, which will be described below, according to the density of the threading screw dislocations in the SiC seed crystal.

2.7. Threading Screw Dislocation Generation Region

In a case where the SiC seed crystal has a relatively high density of the threading screw dislocations, the seed crystal can provide the threading screw dislocations to the c-plane facet. In contrast, in a case where the SiC seed crystal has a relatively low density of the threading screw dislocations (for example, the seed crystal is cut from the single crystal grown by the a-plane growth method), the threading screw dislocations in the region formed by the c-plane facets during the c-plane growth are not sufficient. Thus, the heterogeneous polymorphous crystals and the different surface orientation crystals are easily generated. Further, even though the SiC seed crystal has a relatively high density of the threading screw dislocations, the threading screw dislocations formed in the region formed by the c-plane facets during the c-plane growth may be not sufficient caused by some factors such as a shape of the main growth surface and a local distribution of the threading screw dislocations. In this case, it is preferable to form the threading screw dislocation generation region in the low offset angle region.

[2.7.1. An Example of the Threading Screw Dislocation Generation Region]

The "threading screw dislocation generation region" is a region, which can generate the threading screw dislocations at a higher density than the SiC seed crystal. Methods of forming the threading screw dislocation generation region in the SiC seed crystal include:

(1) growing the seed crystal by the a-plane growth method in such a manner that a region having a high density of the threading screw dislocations is remained (For example, see the patent document 4);

(2) performing a process to disarrange a crystal structure on a surface of the SiC seed crystal (For example, mechanical processing, ion implantation processing, laser processing);

(3) arranging a substrate including the threading screw dislocations at a high density in contact with the SiC seed crystal; and (4) providing a recessed portion (such as a dent or a portion with a different depth from the surface) at a surface portion of the seed crystal and preliminarily growing SiC at the recessed portion.

[2.7.2. Density of the Threading Screw Dislocations in the Seed Crystal on which the Threading Screw Dislocation Generation Region is Formed]

The threading screw dislocation generation region provides the threading screw dislocations to the c-plane facet. Accordingly, in a case where the density of the threading screw dislocations in the seed crystal is high, the threading screw dislocation generation region is not indispensable to the seed crystal. In contrast, in a case where the density of the threading screw dislocations in the seed crystal is low, the threading screw dislocations in the region formed by the c-plane facets during the c-plane growth are not sufficient, and a probability of generation of a heterogeneous polymorphous crystal is increased. Therefore, it is preferable to form the threading screw dislocation generation region when the density of the threading screw dislocations in the seed crystal is low.

Specifically, in a case where a seed crystal is cut from a single crystal which is grown on a seed crystal having an offset angle of 60° to 90° (that is, a seed crystal grown by the a-plane growth method), it is preferable to form the threading screw dislocation generation region on the seed crystal.

[2.7.3. Offset Angle of the Sub-Growth Surface on which the Threading Screw Dislocation Generation Region is Formed]

The threading screw dislocation generation region provides the threading screw dislocations to the c-plane facet. Therefore, the threading screw dislocation generation region is formed on the first sub-growth surface $F_1$ and sub-growth surfaces in the vicinity of the first sub-growth surface $F_1$. Specifically, the threading screw dislocation generation region is preferably to be formed on a region which is a part of the main growth surface and has an offset angle θ of 20° or less. To inhibit a leak of the threading screw dislocations from the threading screw dislocation generation region, the threading screw dislocation generation region is preferably to be formed on a region which is a part of the main growth surface and has an offset angle θ of 4° or less.

Specifically, in a case where the SiC seed crystal has a low density of the threading screw dislocations (for example, in a case where the seed crystal is cut from a single crystal grown by the a-plane growth method), the threading screw dislocation generation region is preferably to be formed on a region which is a part of the main growth surface and has an offset angle θ of 4° or less.

Further, in a case where the SiC seed crystal has a low density of the threading screw dislocations, an absolute number of the threading screw dislocations transferred from the seed crystal to the growing crystal is small. That is, in a high offset angle region, it is not highly necessary to convert the threading screw dislocations in the seed crystal to the basal surface threading edge dislocations and remove the threading edge dislocations to the exterior of the growing crystal. In contrast, in a case where the offset angles in the high offset region are too low, the c-plane facet formed on the low offset region enlarges with the crystal growth. Therefore, in the c-plane facet, a part out of the threading screw dislocation generation region is not supplied with sufficient quantities of step providers causing a generation of the heterogeneous polymorphous crystals.

Accordingly, in a case where the threading screw dislocation generation region is formed, the offset angle $\theta_n$ of the n-th sub-growth surface $F_n$ on which the threading screw dislocation generation region is not formed, is preferably to be set to 4° or greater and 30° or less when the seed crystal has a low density of the threading screw dislocations.

[2.7.4. Area Ratio of the Threading Screw Dislocation Generation Region]

In a case where the threading screw dislocation generation region is formed on a surface of the seed crystal, the threading screw dislocations can be provided to the c-plane facet with certainty by the threading screw dislocation generation region. The crystal grown in the threading screw dislocation generation region has a higher density of the threading screw dislocations than the seed crystal. Therefore, a ratio of the high-quality region to the whole growing crystal decreases when the area ratio of the threading screw dislocation generation region is too large.

To improve a yield of the growing crystal, it is preferable to set the area ratio ($=S_4 \times 100/S_1$) of the threading screw dislocation generation region area $S_4$ to the main growth surface area $S_1$ is set to 50% or less. The threading screw dislocation generation region needs to be formed in such a manner that a moving region of the c-plane facet is covered by the threading screw dislocation generation region. It is more preferable to set the area ratio of the threading screw dislocation generation region to 30% or less, and further more preferable to set the area ratio of the threading screw dislocation generation region to 10% or less.

In a case where the area ratio of the threading screw dislocation generation region is too low, the threading screw dislocation generation region can not cover the whole moving region of the c-plane facet. As a result, it is difficult to provide sufficient amount of the threading screw dislocations to the c-plane facet. Therefore, it is preferable to set the area ratio of the threading screw dislocation generation region (TSDGR) to 2% or greater. It is more preferable to set the area ratio of the threading screw dislocation generation region (TSDGR) to 5% or greater.

The threading screw dislocation generation region may be formed on one sub-growth surface. Alternatively, the threading screw dislocation generation region may be formed across two or more sub-growth surfaces.

In a case where an area of the first sub-growth surface $F_1$ is relatively large, the threading screw dislocation generation region may be formed on the whole first sub-growth surface $F_1$ or on an inner side of the first sub-growth surface $F_1$. In a case where the threading screw dislocation generation is formed on an inner side of a sub-growth surface having an offset angle of 4° or less, a leak of the threading screw dislocations from the threading screw dislocation generation region can be inhibited.

3. Method of Manufacturing SiC Single Crystal

A manufacturing method of a SiC single crystal according to embodiments of the present disclosure includes a fist growth step and a second growth step.

3.1. First Growth Step

The first growth step includes a growing step in which a new crystal is grown on a surface of a SiC seed crystal, which satisfies above-described conditions. As shown in FIG. 1, in a case where the sublimation recrystallization method is used to grow the crystals, in the crucible 14, the SiC seed crystal 12, which satisfies above-described conditions, is disposed at one end portion, and the raw material 16 of SiC is disposed at the other end portion. Then, a new crystal will be grown on the surface of the SiC seed crystal 12 by sublimating the raw material 16.

In the sublimation recrystallization method, the other end portion where the raw material 16 is disposed is maintained at a high temperature, and the end portion where the SiC seed crystal 12 is disposed is maintained at a slightly lower temperature than the other end portion where the raw material 16 is disposed. The temperatures (growth temperatures) in the end portions can be set to any values without limitation as long as the crystal can be grown effectively under the temperatures.

Additionally, in accordance with various purposes, a growth time can also be set to any values without limitation. Also in a growth method (for example, a vapor phase method (CVD method)) other than the sublimation recrystallization method, it is preferable to set growth conditions appropriately so that the new crystal can grow effectively.

To grow a SiC single crystal, in which only a small amount of the threading screw dislocations are generated and the generation of the heterogeneous polymorphous crystals is inhibited, the threading screw dislocations needs to be introduced with certainty in the region formed by the c-plane facets during the c-plane growth.

Methods for controlling a position where the c-plane facet is to be formed include:

(1) providing a predetermined offset angle to the growth surface of the seed crystal;

(2) increasing a radiation performance at a predetermined position where the c-plane facet is to be formed; and (3) increasing a gas concentration.

To control the position where the c-plane facet is to be formed in an early stage of the growth, providing a predetermined offset angle to the growth surface is the most reliable method.

In the present embodiment, the c-plane facet is formed on the first sub-growth surface $F_1$ of the seed crystal, and the offset angle $\theta_1$ of the first sub-growth surface $F_1$ is set to a relatively small value. Therefore, the threading screw dislocations exposed on the first sub-growth surface $F_1$ and sub-growth surfaces in the vicinity of the first sub-growth surface $F_1$ and the threading screw dislocations generated in the threading screw dislocation generation region are easily transferred to the growing crystal. As a result, the threading screw dislocations can be introduced with certainty in the region formed by the c-plane facets during the c-plane growth.

3.2. Second Growth Step

The second growth step includes a cutting step in which the SiC seed crystal 12 according to the present embodiment is cut from the SiC single crystal grown in the first growth step, and a re-growth step in which a new SiC single crystal is grown on the SiC seed crystal 12 obtained from the cutting step. In the second growth step, the re-growth step is repeated at least one time.

Because a growth temperature and a growth time in the second growth step are the same with the growth temperature and the growth time in the first growth step, the growth temperature and the growth time in the second growth step will not be described.

The threading screw dislocations can be reduced only by the first growth step. However, the threading screw dislocations can be reduced further by repeating the re-growth step at least one time. Typically, the density of the threading screw dislocations decreases with an increasing number of repeat times of the re-growth step. However, when a crystal having little threading screw dislocations, like a crystal grown in an a-axis direction, is used as a seed crystal, the generation of the threading screw dislocations is inhibited by repeating the re-growth step.

Since most substrates used for manufacturing devices have an offset angle of 8° or less, when the offset angles of the sub-growth surfaces are greater than 8°, the amount of substrates cut from the SiC single crystal grown in the first growth step will be reduced. Therefore, an extraction ratio of the growing crystal will be improved by setting the off set angles of sub-growth surfaces the same with the offset angle of substrates used for manufacturing devices.

Accordingly, in a case where the offset angles of the sub-growth surfaces in the first growth step have large values, an offset angle $\theta(m)_n$, which is the offset angle of the n-th sub-growth surface $F_n$ of the SiC seed crystal 12 and is used in an m-th re-growth step in the second growth step, is preferable to be set within a value range which is set according to the density range of the threading screw dislocations as described in section [2.3.3], and is reduced to a value close to the offset angle of substrates used for manufacturing devices in each re-growth step or in a step-wise manner (a manner in which the offset angle is maintained at a certain value in several growth steps and is reduced when the density of the threading screw dislocations is reduced to a predetermined value) compared with an offset angle $\theta(m-1)_n$, which is the offset angle of the n-th sub-growth surface $F_n$ of the SiC seed crystal 12 and is used in an (m-1)-th re-growth step in the second growth step. In this case, the offset angle $\theta(m)_1$ of the first sub-growth surface $F_1$ may be set to a value smaller than the offset angle $\theta(m-1)_n$ in each re-growth step or in a step-wise manner like the offset angle $\theta(m)_n$ of the n-th sub-growth surface $F_n$. Alternatively, the offset angle $\theta(m)_1$ of the first sub-growth surface $F_1$ may also be reduced independently from the offset angle $\theta(m)_n$. When the offset angle $\theta(m)_1$ is already set to be small enough, the offset angle $\theta(m)_1$ may be maintained at a constant value.

Additionally, in a case where the density of the threading screw dislocations is high, during the second growth step, when an angle difference between the offset direction (an average direction parallel to a segment of line from the uppermost portion $Y_1$ of the {0001} plane to the lowermost portion $Y_2$ of the {0001} plane when the uppermost portion $Y_1$ of the {0001} plane and the lowermost portion $Y_2$ of the {0001} plane are points; the same direction with the offset direction of the first sub-growth surface $F_1$ when one of the uppermost portion $Y_1$ of the {0001} plane and the lowermost portion $Y_2$ of the {0001} plane is a line) of the m-th re-growth step and the offset direction of the (m-1)-th re-growth step is set within a range of 45° to 135° on the {0001} plane, the density of the threading screw dislocations (TSD) can be reduced effectively.

In a case where the re-growth step is repeated, the basal surface threading edge dislocations converted from the threading screw dislocations in the growing crystal are difficult to be transferred to the next re-growth step by rotating the offset direction of the first sub-growth surface $F_1$ on the {0001} plane.

At this time, there is no need to change a position of the uppermost portion $Y_1$ of the {0001} plane on the first sub-growth surface $F_1$ when an onset substrate is used. However, the position of the uppermost portion $Y_1$ of the {0001} plane on the first sub-growth surface $F_1$ needs to be changed in each re-growth step when an offset substrate is used. Therefore, it is preferable that the offset direction on the {0001} plane is not rotated when the density of the threading screw dislocations on the first sub-growth surface $F_1$ is reduced to a predetermined level (a level enough to control the generation of the heterogeneous polymorphous crystals).

4. Embodiments 4.1. First Embodiment

Figure 3A:
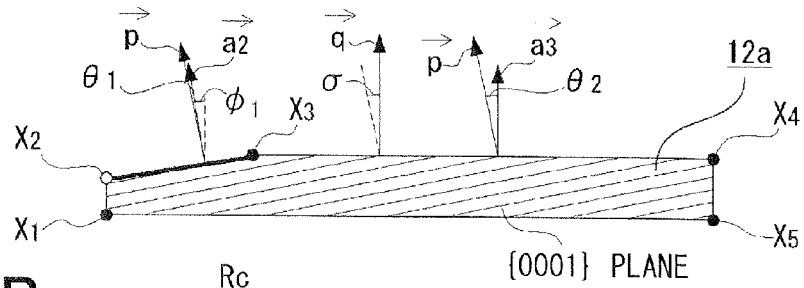
FIG. 3A is a cross-sectional view of a SiC seed crystal according to a first embodiment.

As shown in FIG. 3A, a SiC seed crystal 12a has an approximately rectangular cross-sectional surface, and has an inclined surface $X_2X_3$ at a left top corner. The SiC seed crystal 12a is a so-called offset substrate in which the {0001} plane inclined angle σ>0. The uppermost portion $Y_1$ of the {0001} plane is a point $X_2$. A sub-growth surface $X_2X_3$ has an inclined angle that satisfies a relationship of $\phi_1 \leq \sigma$. A sub-growth surface $X_3X_4$ has an inclined angle $\phi_2$ equal to 0. A point $X_4$ is the most distant point on the periphery of the main growth surface from the point $X_2$, and is also the lowermost portion $Y_2$ of the {0001} plane.

A normal vector of a surface $X_1X_2$ and a normal vector of a surface $X_4X_5$ are perpendicular to the vector q. A surface $X_1X_5$ is in contact with the crucible 14 or the seed crystal pedestal 18. Thus, the main growth surface is composed of the surface $X_2X_3$ and the surface $X_3X_4$. The SiC seed crystal 12a has a plurality of sub-growth surfaces in a direction (main direction) from the uppermost portion $X_2$ of the {0001} plane to the point $X_4$ on the periphery of the main growth surface. Among the sub-growth surfaces in the main direction, the sub-growth surface $X_2X_3$ includes the uppermost portion $Y_1$ of the {0001} plane and is the first sub-growth surface $F_1$. The second sub-growth surface $F_2$ is the surface $X_3X_4$ and $\theta_1 < \theta_2$.

The SiC seed crystal 12a has little threading screw dislocations. Therefore, the threading screw dislocation generation region, which is shown in a bold line in FIG. 3A, is formed on the surface $X_2X_3$.

As shown in FIG. 3A, in a case where the seed crystal has little threading screw dislocations, the threading screw dislocation generation region needs to be formed on the first sub-growth surface $X_2X_3$ so that the generation of the heterogeneous polymorphous crystals can be inhibited by the threading screw dislocations introduced to the region $(R_c)$ formed by the c-plane facets during the c-plane growth. In this case, a difference between a density of the threading screw dislocations on the first sub-growth surface $X_2X_3$ and a density of the threading screw dislocations on the second sub-growth surface $X_3X_4$, which has no threading screw dislocation generation region, is extremely great. Therefore, even if the dislocations are leaked from the threading screw dislocation generation region at a small ratio, an increasing rate of the threading screw dislocations in the high-quality region, which is formed on the second sub-growth surface $X_3X_4$, will rise. Thus, it is preferable to totally inhibit a leak of the dislocations from the threading screw dislocation generation region.

Figure 3B:
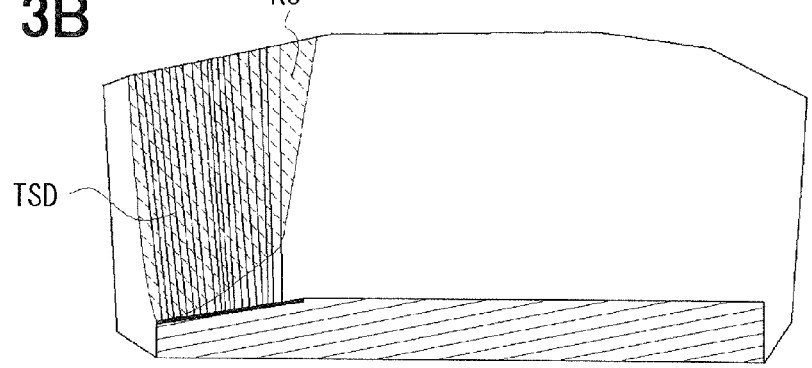
FIG. 3B is a cross-sectional view of a SiC single crystal grown with the SiC seed crystal shown in FIG. 3A.

A conversion ratio of the threading screw dislocations to the basal surface threading edge dislocations decreases with a decreasing offset angle $\theta_1$ of the first sub-growth surface $X_2X_3$ on which the threading screw dislocation generation region is formed. As shown in FIG. 3B, specifically, in a case where the offset angle $\theta_1$ is 20° or less, most of the threading screw dislocations (TSD) in the threading screw dislocation generation region are transferred to the growing crystal.

However, in a case where the threading screw dislocation generation region has a high density of the threading screw dislocations, since the lower side (high-quality side) of the {0001} plane originally has no threading screw dislocations, the leaked dislocations from the upper portion of the {0001} plane can not be neglected even though the amount of the leaked dislocations is small. It is preferable to set the offset angle $\theta_1$ to 4° or less to totally inhibit the leak of dislocations from the threading screw dislocation generation region.

Meanwhile, a growth height necessary for removing the stacking faults increases when the offset angle $\theta_2$ of the second sub-growth surface $F_2$ is too large. Thus, it is preferable to set the offset angle $\theta_2$ to 15° or less.

4.2. Second Embodiment

Figure 4A:
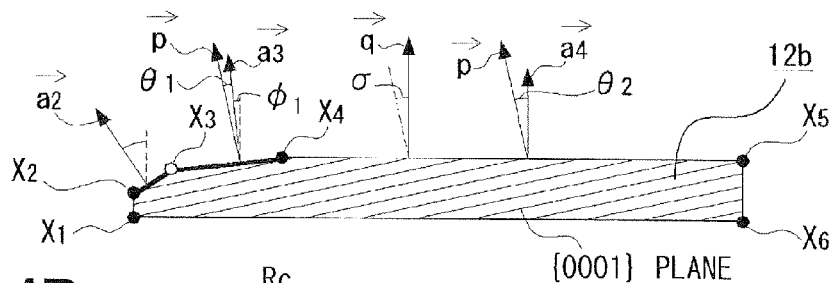
FIG. 4A is a cross-sectional view of a SiC seed crystal according to a second embodiment.

As shown in FIG. 4A, a SiC seed crystal 12b has a rectangular cross-sectional surface, and has two inclined surfaces $X_2X_3$ and $X_3X_4$ with different inclined angles at a left top corner. The SiC seed crystal 12b is a so-called offset substrate in which the {0001} plane inclined angle σ>0. The uppermost portion $Y_1$ of the {0001} plane is a point $X_3$. A sub-growth surface $X_3X_4$ has an inclined angle $\phi_1$ that satisfies a relationship of $\phi_1 \leq \sigma$. A sub-growth surface $X_4X_5$ has an inclined angle $\phi_2$ equal to 0. A point $X_5$ is the most distant point on the periphery of the main growth surface from the point $X_3$, and is also the lowermost portion $Y_2$ of the {0001} plane.

A normal vector of a surface $X_1X_2$ and a normal vector of a surface $X_5X_6$ are perpendicular to the vector q. A surface $X_1X_6$ is in contact with the crucible 14 or the seed crystal pedestal 18. Thus, the main growth surface is composed of the surface $X_2X_3$, the surface $X_3X_4$ and the surface $X_4X_5$. The SIC seed crystal 12b has a plurality of sub-growth surfaces in a direction (main direction) from the uppermost portion $X_3$ of the {0001} plane to the point $X_5$ on the periphery of the main growth surface. Among the sub-growth surfaces in the main direction, the sub-growth surface $X_3X_4$ includes the uppermost portion $Y_1$ of the {0001} plane and is the first sub-growth surface $F_1$. The second sub-growth surface $F_2$ is the surface $X_4X_5$ and $\theta_1 < \theta_2$.

The SiC seed crystal 12b has little threading screw dislocations. Therefore, the threading screw dislocation generation region, which is shown in a bold line in FIG. 4A, is formed on the surface $X_2X_3$ and the surface $X_3X_4$.

At the beginning of the growth, the seed crystal grows in a radial direction depending on a structure of the crucible 14. Therefore, in a case where the uppermost portion $Y_1$ of the {0001} plane is positioned at an end portion of the main growth surface, the growing uppermost portion $Y_1$ (c-plane facet) of the {0001} plane may grow out of the seed crystal, the density of the threading screw dislocations may decrease temporarily, and the generation of the heterogeneous polymorphous crystals may be caused.

Figure 4B:
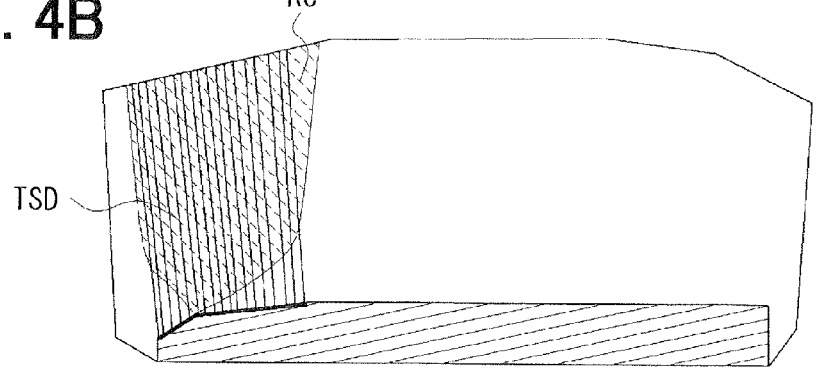
FIG. 4B is a cross-sectional view of a SiC single crystal grown with the SiC seed crystal shown in FIG. 4A.

In contrast, the SiC seed crystal 12b has the inclined surfaces $X_2X_3$ and $X_3X_4$, which are disposed in such a manner that the uppermost portion $X_3$ of the {0001} plane is disposed at an inner side on the main growth surface. Therefore, as shown in FIG. 4B, in the SiC seed crystal 12b, the c-plane facet has a low potential of growing out of a high-density threading screw dislocation (TSD) region even though the crystal grows in the radial direction. As a result, the generation of the heterogeneous polymorphous crystals caused by the temporary decrease in the density of the threading screw dislocations can be inhibited.

4.3. Third Embodiment

Figure 5A:
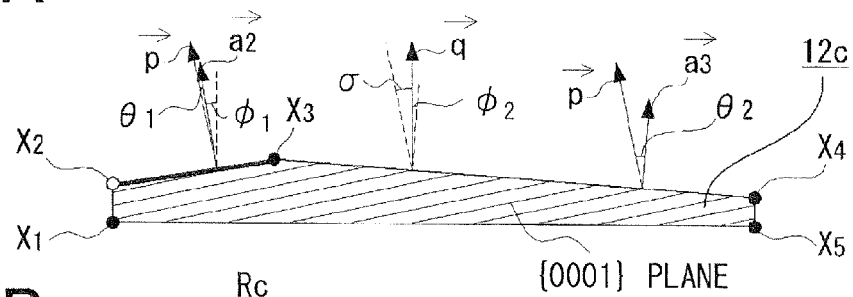
FIG. 5A is a cross-sectional view of a SiC seed crystal according to a third embodiment.

As shown in FIG. 5A, a SIC seed crystal 12c has two inclined surfaces $X_2X_3$ and $X_3X_4$ at a raw material side. The surfaces $X_2X_3$ and $X_3X_4$ have different inclined angles. The SiC seed crystal 12c is a so-called offset substrate in which the {0001} plane inclined angle σ>0. The uppermost portion $Y_1$ of the {0001} plane is a point $X_2$. A sub-growth surface $X_2X_3$ has an inclined angle $\phi_1$ that satisfies a relationship of $\phi_1 \leq \sigma$. A sub-growth surface $X_3X_4$ has an inclined angle $\phi_2$ that satisfies a relationship of $\phi_2 > 0$. A point $X_4$ is the most distant point on the periphery of the main growth surface from the point $X_2$, and is also the lowermost portion $Y_2$ of the {0001} plane.

A normal vector of a surface $X_1X_2$ and a normal vector of a surface $X_4X_5$ are perpendicular to the vector q. A surface $X_1X_5$ is in contact with the crucible 14 or the seed crystal pedestal 18. Thus, the main growth surface is composed of the surface $X_2X_3$ and the surface $X_3X_4$. The SiC seed crystal 12c has a plurality of sub-growth surfaces in a direction (main direction) from the uppermost portion $X_2$ of the {0001} plane to the point $X_4$ on the periphery of the main growth surface. Among the sub-growth surfaces in the main direction, the sub-growth surface $X_2X_3$ includes the uppermost portion $Y_1$ of the {0001} plane and is the first sub-growth surface $F_1$. The second sub-growth surface $F_2$ is the surface $X_3X_4$ and $\theta_1 < \theta_2$.

The SiC seed crystal 12c has little threading screw dislocations. Therefore, the threading screw dislocation generation region, which is shown in a bold line in FIG. 5A, is formed on the surface $X_2X_3$.

Figure 5B:
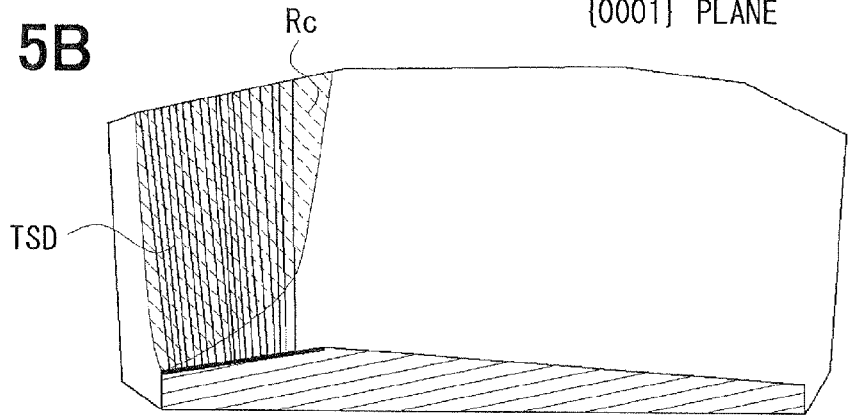
FIG. 5B is a cross-sectional view of a SiC single crystal grown with the SiC seed crystal shown in FIG. 5A.

Since the SiC seed crystal 12c satisfies a relationship of $\phi_2 > 0$, the offset angle $\theta_2$ of the second sub-growth surface $X_3X_4$ is greater than the offset angle $\theta_2$ of the SiC seed crystal 12a shown in FIG. 3A. As a result, as shown in FIG. 5B, in a case where the threading screw dislocations (TSD) are exposed on the second sub-growth surface $X_3X_4$, the threading screw dislocations are easily converted to the basal surface threading edge dislocations. Further, a generation of new threading screw dislocations on the second sub-growth surface $X_3X_4$ can be easily inhibited.

4.4. Fourth Embodiment

Figure 6A:
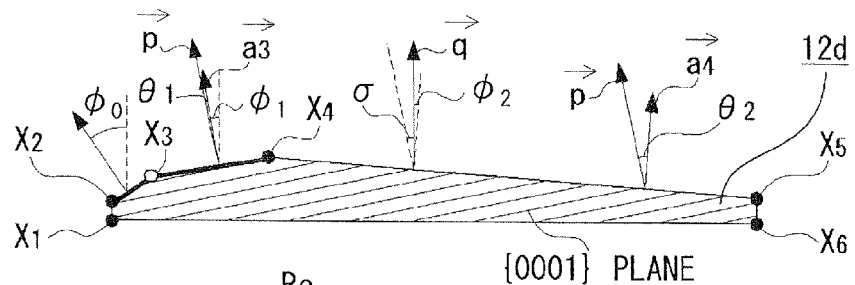
FIG. 6A is a cross-sectional view of a SiC seed crystal according to a fourth embodiment.

As shown in FIG. 6A, a SiC seed crystal 12d has three inclined surfaces $X_2X_3$, $X_3X_4$ and $X_4X_5$ at the raw material side. The surfaces $X_2X_3$, $X_3X_4$ and $X_4X_5$ have different inclined angles. The SiC seed crystal 12d is a so-called offset substrate in which the {0001} plane inclined angle σ>0. The uppermost portion $Y_1$ of the {0001} plane is a point $X_3$. A sub-growth surface $X_3X_4$ has an inclined angle $\phi_1$ that satisfies a relationship of $\phi_1 \leq \sigma$. A sub-growth surface $X_4X_5$ has an inclined angle $\phi_2$ that satisfies a relationship of $\phi_2 > 0$. A point $X_5$ is the most distant point on the periphery of the main growth surface from the point $X_3$, and is also the lowermost portion $Y_2$ of the {0001} plane.

A normal vector of a surface $X_1X_2$ and a normal vector of a surface $X_5X_6$ are perpendicular to the vector q. A surface $X_1X_6$ is in contact with the crucible 14 or the seed crystal pedestal 18. Thus, the main growth surface is composed of the surface $X_2X_3$, the surface $X_3X_4$ and the surface $X_4X_5$. The SiC seed crystal 12d has a plurality of sub-growth surfaces in a direction (main direction) from the uppermost portion $X_3$ of the {0001} plane to the point $X_5$ on the periphery of the main growth surface. Among the sub-growth surfaces in the main direction, the sub-growth surface $X_3X_4$ includes the uppermost portion $Y_1$ of the {0001} plane and is the first sub-growth surface $F_1$. The second sub-growth surface $F_2$ is the surface $X_4X_5$ and $\theta_1 < \theta_2$.

The SiC seed crystal 12d has little threading screw dislocations. Therefore, the threading screw dislocation generation region (TSDGR), which is shown in a bold line in FIG. 6A, is formed on the surface $X_2X_3$ and the surface $X_3X_4$.

Figure 6B:
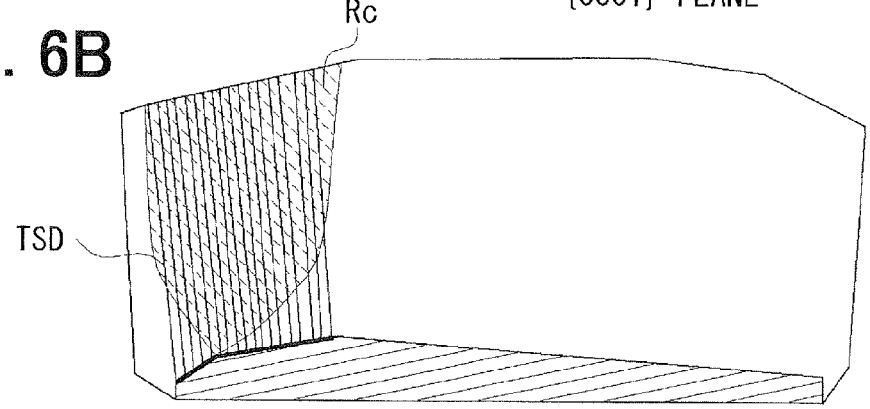
FIG. 6B is a cross-sectional view of a SiC single crystal grown with the SiC seed crystal shown in FIG. 6A.

The SiC seed crystal 12d has the inclined surfaces $X_2X_3$ and $X_3X_4$, which are disposed in such a manner that the uppermost portion $X_3$ of the {0001} plane is disposed at an inner side on the main growth surface. Therefore, as shown in FIG. 6B, in the SiC seed crystal 12d, even though the crystal grows in a radial direction, the c-plane facet has a low potential of growing out of the high-density threading screw dislocation (TSD) region. As a result, the generation of the heterogeneous polymorphous crystals caused by the temporary decrease in the density of the threading screw dislocations can be inhibited.

Further, since the SiC seed crystal 12d satisfies a relationship of $\phi_2>0$, the offset angle $\theta_2$ of the second sub-growth surface $X_3X_4$ is greater than the offset angle $\theta_2$ of the SiC seed crystal 12b shown in FIG. 4A. As a result, in a case where the threading screw dislocations (TSD) are exposed on the second sub-growth surface $X_4X_5$, the threading screw dislocations are easily converted to the basal surface threading edge dislocations. Further, a generation of new threading screw dislocations on the second sub-growth surface $X_4X_5$ can be easily inhibited.

4.5. Fifth Embodiment

Figure 7A:
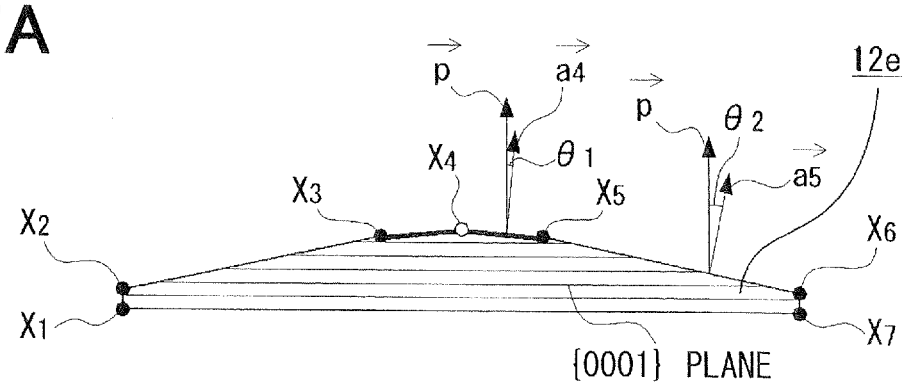
FIG. 7A is a cross-sectional view of a SiC seed crystal according to a fifth embodiment.

As shown in FIG. 7A, a SiC seed crystal 12e has four inclined surfaces $X_2X_3$, $X_3X_4$, $X_4X_5$ and $X_5X_6$ at the raw material side. The surfaces $X_2X_3$, $X_3X_4$, $X_4X_5$ and $X_5X_6$ have different inclined angles. The SiC seed crystal 12e is a so-called onset substrate in which the {0001} plane inclined angle σ=0. The uppermost portion $Y_1$ of the {0001} plane is a point $X_4$. A sub-growth surface $X_4X_5$ has an inclined angle $\phi_1$ that satisfies a relationship of $\phi_1=\theta_1$. A sub-growth surface $X_5X_6$ has an inclined angle $\phi_2$ that satisfies a relationship of $\phi_2=\theta_2$. The surfaces $X_2X_3$ and $X_3X_4$ are equivalent to the surfaces $X_4X_5$ and $X_5X_6$ respectively. Hereafter, the surfaces $X_4X_5$ and $X_5X_6$ are mainly used for description. However, the surfaces $X_2X_3$ and $X_3X_4$ are equivalent to the surfaces $X_4X_5$ and $X_5X_6$ respectively. A point $X_6$ is the most distant point on the periphery of the main growth surface from the point $X_4$ and is also the lowermost portion $Y_2$ of the {0001} plane.

A normal vector of a surface $X_1X_2$ and a normal vector of a surface $X_6X_7$ are perpendicular to the vector q. A surface $X_1X_7$ is in contact with the crucible 14 or the seed crystal pedestal 18. Thus, the main growth surface is composed of the surface $X_2X_3$, the surface $X_3X_4$, the surface $X_4X_5$ and the surface $X_5X_6$. The SiC seed crystal 12e has a plurality of sub-growth surfaces in a direction (main direction) from the uppermost portion $X_4$ of the {0001} plane to the point $X_6$ on the periphery of the main growth surface. Among the sub-growth surfaces in the main direction, the sub-growth surface $X_4X_5$ includes the uppermost portion $Y_1$ of the {0001} plane and is the first sub-growth surface $F_1$. The second sub-growth surface $F_2$ is the surface $X_5X_6$ and $\theta_1<\theta_2$.

The SiC seed crystal 12e has little threading screw dislocations. Therefore, the threading screw dislocation generation region, which is shown in a bold line in FIG. 7A, is formed on the surface $X_3X_4$ and the surface $X_4X_5$.

Figure 7B:
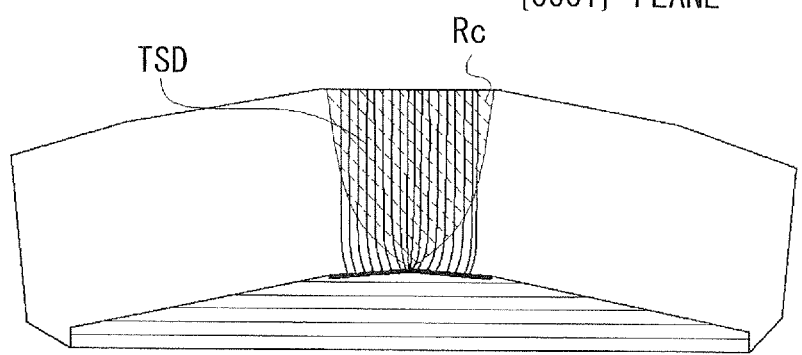
FIG. 7B is a cross-sectional view of a SiC single crystal grown with the SiC seed crystal shown in FIG. 7A.

Since the SiC seed crystal 12e is an onset substrate in which the vector p and the vector q are in the same direction, the threading screw dislocation generation region is formed on a center of the main growth surface. As shown in FIG. 7B, when a SiC single crystal 12e described above is used for growing a crystal, the threading screw dislocations (TSD) in the threading screw dislocation generation region are transferred to the growing crystal providing the threading screw dislocations (TSD) to the region ($R_c$) formed by the c-plane facets. As a result, the generation of the heterogeneous polymorphous crystals is inhibited. Further, the offset angle $\theta_1$ of the first sub-growth surface $X_4X_5$ is small enough to inhibit a leak of the basal surface threading edge dislocations from the threading screw dislocation generation region. Meanwhile, the offset angle $\theta_2$ of the second sub-growth surface $X_5X_6$ is relatively large. Therefore, in a case where the seed crystal has the threading screw dislocations, the threading screw dislocations can be converted to the basal surface threading edge dislocations, and can be removed to the exterior of the growing crystal. Further, a generation of new threading screw dislocations (TSD) on the second sub-growth surface $X_5X_6$ can be inhibited.

4.6. Sixth Embodiment

Figure 8A:
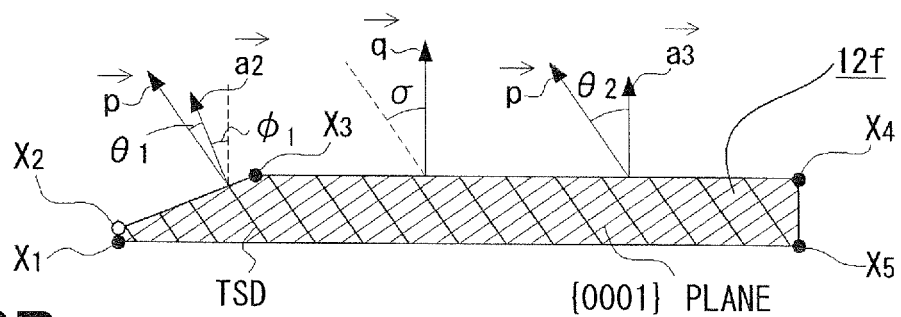
FIG. 8A is a cross-sectional view of a SiC seed crystal according to a sixth embodiment.

As shown in FIG. 8A, a SiC seed crystal 12f has an approximately rectangular cross-sectional surface, and has an inclined surface $X_2X_3$ at a left top corner. The SiC seed crystal 12f is a so-called offset substrate in which the {0001} plane inclined angle σ>0. The uppermost portion $Y_1$ of the {0001} plane is a point $X_2$. A sub-growth surface $X_2X_3$ has an inclined angle $\phi_1$ that satisfies a relationship of $\phi_1 \leq \sigma$. A sub-growth surface $X_3X_4$ has an inclined angle $\phi_2$ equal to 0. A point $X_4$ is the most distant point on the periphery of the main growth surface from the point $X_2$, and is also the lowermost portion $Y_2$ of the {0001} plane.

A normal vector of a surface $X_1X_2$ and a normal vector of a surface $X_4X_5$ are perpendicular to the vector q. A surface $X_1X_5$ is in contact with the crucible 14 or the seed crystal pedestal 18. Thus, the main growth surface is composed of the surface $X_2X_3$ and the surface $X_3X_4$. The SiC seed crystal 12f has a plurality of sub-growth surfaces in a direction (main direction) from the uppermost portion $X_2$ of the {0001} plane to the point $X_4$ on the periphery of the main growth surface. Among the sub-growth surfaces in the main direction, the sub-growth surface $X_2X_3$ includes the uppermost portion $Y_1$ of the {0001} plane and is the first sub-growth surface $F_1$. The second sub-growth surface $F_2$ is the surface $X_3X_4$ and $\theta_1<\theta_2$.

The SiC seed crystal 12f has a predetermined amount of the threading screw dislocations. Therefore, the threading screw dislocation generation region is not formed on the surface $X_2X_3$. In a case where the seed crystal has several hundreds of the threading screw dislocations per square centimeter, there is no need to set the offset angle $\theta_1$ of the first sub-growth surface $X_2X_3$ to an extremely small value. The offset angle $\theta_1$ of the first sub-growth surface $X_2X_3$ may be approximately set to a value 20° or less. Since the offset angle $\theta_2$ of the second sub-growth surface $X_3X_4$ is greater than the offset angle $\theta_1$ of the first sub-growth surface $X_2X_3$, the threading screw dislocations can be easily removed to the exterior of the growing crystal even when the dislocations are leaked from the first sub-growth surface $X_2X_3$.

To effectively reduce a density of the threading screw dislocations in the growing crystal, which is growing on the second sub-growth surface $X_3X_4$, it is preferable to set the offset angle $\theta_2$ of the second sub-growth surface $X_3X_4$ as large as possible within the range of 20° or greater. However, when regions having extremely different offset angles are formed on the main growth surface, a subgrain boundary may be generated at a boundary of the regions having different offset angle.

For example, in a case where a seed crystal that has a high density of the threading screw dislocations is used to reduce the threading screw dislocations by great amount, the offset angle $\theta_1$ may be set to 20°, and the offset angle $\theta_2$ is preferable to be set as large as possible with a consideration of a thickness range of the seed crystal and a generation of the subgrain boundary.

In contrast, in a case where a seed crystal that has a low density of the threading screw dislocations is used to reduce the threading screw dislocations little by little, or in a case where unexpected threading screw dislocations are compensated to maintain a quality of the growing crystal, the offset angle $\theta_1$ may be set to a relatively small value, and the offset angle $\theta_2$ is preferable to be set to 20° or less.

Figure 8B:
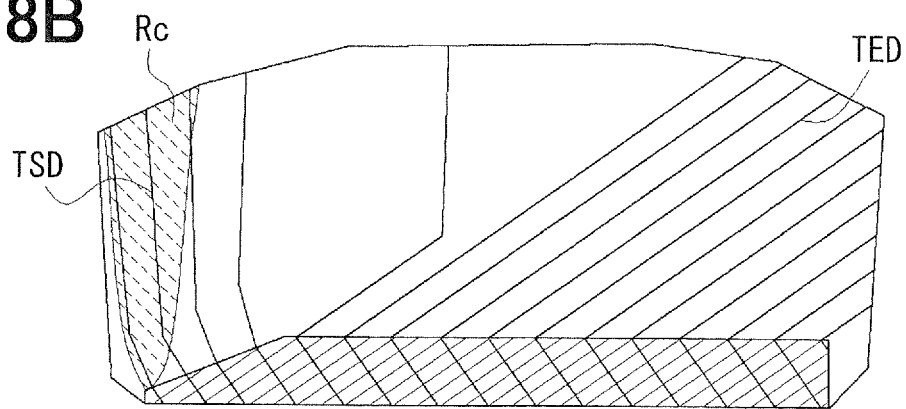
FIG. 8B is a cross-sectional view of a SiC single crystal grown with the SiC seed crystal shown in FIG. 8A.

As shown in FIG. 8B, when the SiC seed crystal 12f described above is used for growing the crystal, the threading screw dislocations (TSD) in the seed crystal are transferred to the growing crystal within the low offset angle region. Accordingly, the threading screw dislocations (TSD) are provided to the facet and a generation of the heterogeneous polymorphous crystals is inhibited. Meanwhile, in the high offset angle region, the threading screw dislocations (TSD) are converted to the basal surface threading edge dislocations (TED), and are easily removed to the exterior of the growing crystal. As a result, the density of the threading screw dislocations (TSD) in the growing crystal is reduced. When a growth step described above is repeated several times, the density of the threading screw dislocations (TSD) in the region ($R_c$) formed by the c-plane facets during the c-plane growth is increased. Thus, a dislocation control seed crystal, which has a low density of the threading screw dislocations in the high-quality region, can be obtained.

4.7. Seventh Embodiment

Figure 9A:
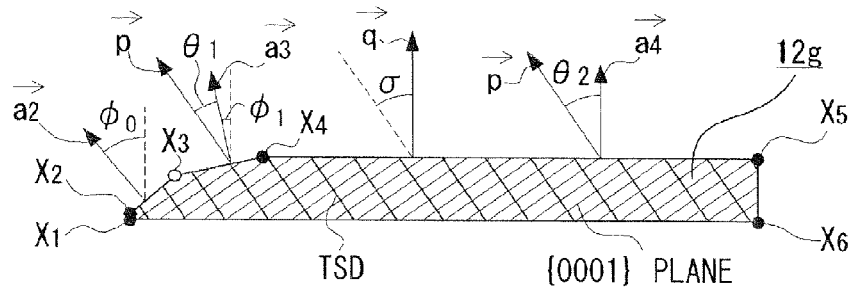
FIG. 9A is a cross-sectional view of a SIC seed crystal according to a seventh embodiment.

As shown in FIG. 9A, a SiC seed crystal 12g has an rectangular cross-sectional surface, and has two inclined surfaces $X_2X_3$ and $X_3X_4$ at a left top corner. The two inclined surfaces $X_2X_3$ and $X_3X_4$ have different inclined angles. The SiC seed crystal 12g is a so-called offset substrate in which the {0001} plane inclined angle $\sigma>0$. The uppermost portion $Y_1$ of the {0001} plane is a point $X_3$. A sub-growth surface $X_3X_4$ has an inclined angle $\phi_1$ that satisfies a relationship of $\phi_1 \leq \sigma$. A sub-growth surface $X_4X_5$ has an inclined angle $\phi_2$ equal to 0. A point $X_5$ is the most distant point on the periphery of the main growth surface from the point $X_3$, and is also the lowermost portion $Y_2$ of the {0001} plane.

A normal vector of a surface $X_1X_2$ and a normal vector of a surface $X_5X_6$ are perpendicular to the vector q. A surface $X_1X_6$ is in contact with the crucible 14 or the seed crystal pedestal 18. Thus, the main growth surface is composed of the surface $X_2X_3$, the surface $X_3X_4$ and the surface $X_4X_5$. The SiC seed crystal 12g has a plurality of sub-growth surfaces in a direction (main direction) from the uppermost portion $X_3$ of the {0001} plane to the point $X_5$ on the periphery of the main growth surface. Among the sub-growth surfaces in the main direction, the sub-growth surface $X_3X_4$ includes the uppermost portion $Y_1$ of the {0001} plane and is the first sub-growth surface $F_1$. The second sub-growth surface $F_2$ is the surface $X_4X_5$ and $\theta_1 < \theta_2$.

The SiC seed crystal 12g has a predetermined amount of the threading screw dislocations. Therefore, the threading screw dislocation generation region is not formed on the surface $X_3X_4$ and on a region in the vicinity of the surface $X_3X_4$.

Figure 9B:
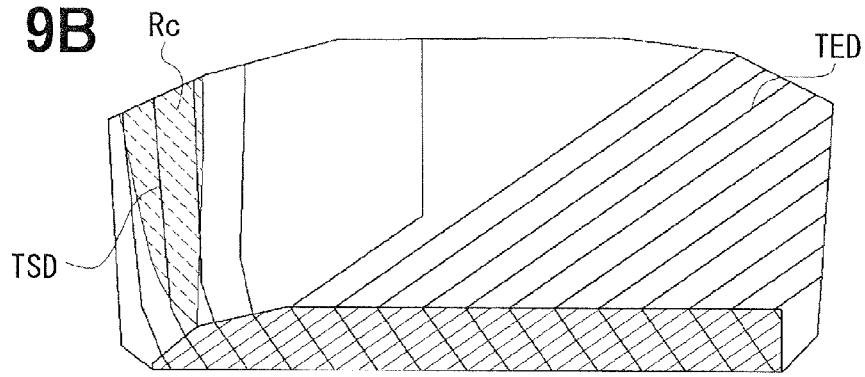
FIG. 9B is a cross-sectional view of a SiC single crystal grown with the SiC seed crystal shown in FIG. 9A.

As shown in FIG. 9B, when the SiC seed crystal 12g described above is used for growing the crystal, the threading screw dislocations (TSD) in the seed crystal are transferred to the growing crystal within the low offset angle region. Accordingly, the threading screw dislocations (TSD) are provided to the facet and a generation of the heterogeneous polymorphous crystals is inhibited. Meanwhile, in the high offset angle region, the threading screw dislocations (TSD) are converted to the basal surface threading edge dislocations (TED), and are easily removed to the exterior of the growing crystal. As a result, the density of the threading screw dislocations (TSD) in the growing crystal is reduced. When a growth step described above is repeated several times, the density of the threading screw dislocations (TSD) in the region ($R_c$) formed by the c-plane facets during the c-plane growth is increased. Thus, a dislocation control seed crystal, which has a low density of the threading screw dislocations in the high-quality region, can be obtained.

Further, the SiC seed crystal 12g has the inclined surfaces $X_2X_3$ and $X_3X_4$, which are disposed in such a manner that the uppermost portion $X_3$ of the {0001} plane is disposed at an inner side on the main growth surface. Therefore, as shown in FIG. 9B, in the SiC seed crystal 12g, the c-plane facet has a low potential of growing out of the high-density threading screw dislocation (TSD) region even though the crystal grows in a radial direction. As a result, the generation of the heterogeneous polymorphous crystals caused by the temporary decrease in the density of the threading screw dislocations can be inhibited.

4.8. Eighth Embodiment

Figure 10A:
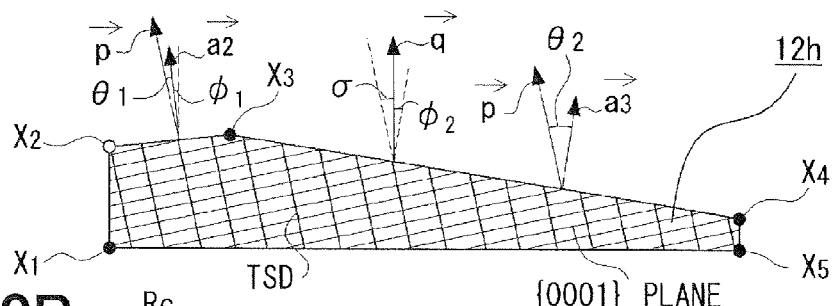
FIG. 10A is a cross-sectional view of a SiC seed crystal according to a eighth embodiment.

As shown in FIG. 10A, a SiC seed crystal 12h has two inclined surfaces $X_2X_3$ and $X_3X_4$ at the raw material side. The surfaces $X_2X_3$ and $X_3X_4$ have different inclined angles. The SiC seed crystal 12h is a so-called offset substrate in which the {0001} plane inclined angle $\sigma>0$. The uppermost portion $Y_1$ of the {0001} plane is a point $X_2$.

A sub-growth surface $X_2X_3$ has an inclined angle $\phi_1$ that satisfies a relationship of $\phi_1 \leq \sigma$. A sub-growth surface $X_3X_4$ has an inclined angle $\phi_2$ that satisfies a relationship of $\phi_2>0$. A point $X_4$ is the most distant point on the periphery of the main growth surface from the point $X_2$, and is also the lowermost portion $Y_2$ of the {0001} plane.

A normal vector of a surface $X_1X_2$ and a normal vector of a surface $X_4X_5$ are perpendicular to the vector q. A surface $X_1X_5$ is in contact with the crucible 14 or the seed crystal pedestal 18. Thus, the main growth surface is composed of the surface $X_2X_3$ and the surface $X_3X_4$. The SiC seed crystal 12h has a plurality of sub-growth surfaces in a direction (main direction) from the uppermost portion $X_2$ of the {0001} plane to the point $X_4$ on the periphery of the main growth surface. Among the sub-growth surfaces in the main direction, the sub-growth surface $X_2X_3$ includes the uppermost portion $Y_1$ of the {0001} plane and is the first sub-growth surface $F_1$. The second sub-growth surface $F_2$ is the surface $X_3X_4$ and $\theta_1 < \theta_2$.

The SiC seed crystal 12h has a predetermined amount of the threading screw dislocations. Therefore, the threading screw dislocation generation region is not formed on the surface $X_2X_3$.

Figure 10B:
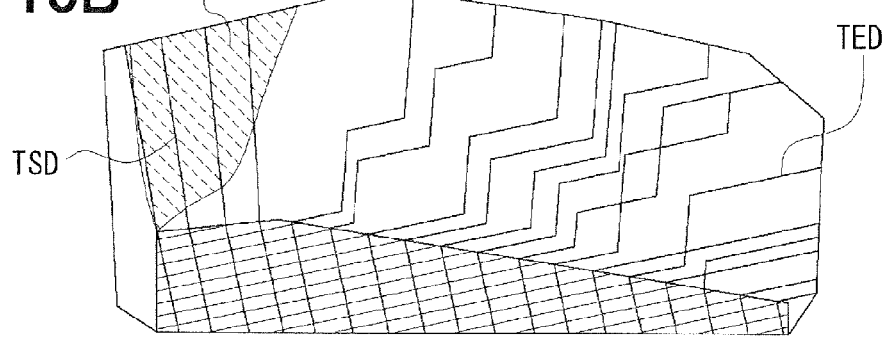
FIG. 10B is a cross-sectional view of a SIC single crystal grown with the SiC seed crystal shown in FIG. 10A.

Since the SiC seed crystal 12h has the inclined angle $\phi_2$ that satisfies a relationship of $\phi_2>0$, the offset angle $\theta_2$ of the second sub-growth surface $X_3X_4$ is greater than the offset angle $\theta_2$ of the SiC seed crystal 12f shown in FIG. 8A. As a result, as shown in FIG. 10B, in a case where the threading screw dislocations (TSD) are exposed on the second sub-growth surface $X_3X_4$, the threading screw dislocations are easily converted to the basal surface threading edge dislocations. Further, a generation of the threading screw dislocations (TSD) on the second sub-growth surface $X_3X_4$ can be easily inhibited.

4.9. Ninth Embodiment

Figure 11A:
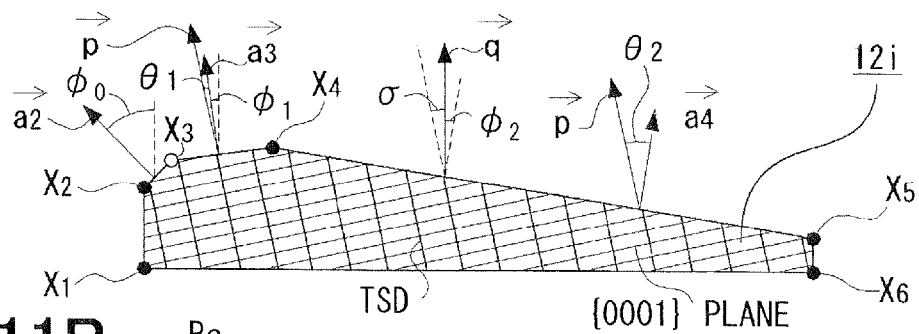
FIG. 11A is a cross-sectional view of a SiC seed crystal according to a ninth embodiment.

As shown in FIG. 11A, a SiC seed crystal 12i has three inclined surfaces $X_2X_3$, $X_3X_4$ and $X_4X_5$ at the raw material side. The surfaces $X_2X_3$, $X_3X_4$ and $X_4X_5$ have different inclined angles. The SiC seed crystal 12$i$ is a so-called offset substrate in which the {0001} plane inclined angle σ>0. The uppermost portion $Y_1$ of the {0001} plane is a point $X_3$. A sub-growth surface $X_3X_4$ has an inclined angle $\phi_1$ that satisfies a relationship of $\sigma_1 \geq \sigma$. A sub-growth surface $X_4X_5$ has an inclined angle $\phi_2$ that satisfies a relationship of $\phi_2>0$. A point $X_5$ is the most distant point on the periphery of the main growth surface from the point $X_3$, and is also the lowermost portion $Y_2$ of the {0001} plane.

A normal vector of a surface $X_1X_2$ and a normal vector of a surface $X_5X_6$ are perpendicular to the vector q. A surface $X_1X_6$ is in contact with the crucible 14 or the seed crystal pedestal 18. Thus, the main growth surface is composed of the surface $X_2X_3$, the surface $X_3X_4$ and the surface $X_4X_5$. The SiC seed crystal 12$i$ has a plurality of sub-growth surfaces in a direction (main direction) from the uppermost portion $X_3$ of the {0001} plane to the point $X_5$ on the periphery of the main growth surface. Among the sub-growth surfaces in the main direction, the sub-growth surface $X_3X_4$ includes the uppermost portion $Y_1$ of the {0001} plane and is the first sub-growth surface $F_1$. The second sub-growth surface $F_2$ is the surface $X_4X_5$ and $\theta_1<\theta_2$.

The SiC seed crystal 12$i$ has a predetermined amount of the threading screw dislocations. Therefore, the threading screw dislocation generation region is not formed on the surface $X_3X_4$ and on a region in the vicinity of the surface $X_3X_4$.

Since the SiC seed crystal 12$i$ has the inclined angle $\phi_2$ that satisfies a relationship of $\phi_2>0$, the offset angle $\theta_2$ of the second sub-growth surface $X_3X_4$ is greater than the offset angle $\theta_2$ of the SiC seed crystal 12$g$ shown in FIG. 9A. As a result, the threading screw dislocations (TSD), which are exposed on the second sub-growth surface $X_4X_5$, are easily converted to the basal surface threading edge dislocations (TED). Further, a generation of the threading screw dislocations (TSD) on the second sub-growth surface $X_4X_5$ can be inhibited.

Figure 11B:
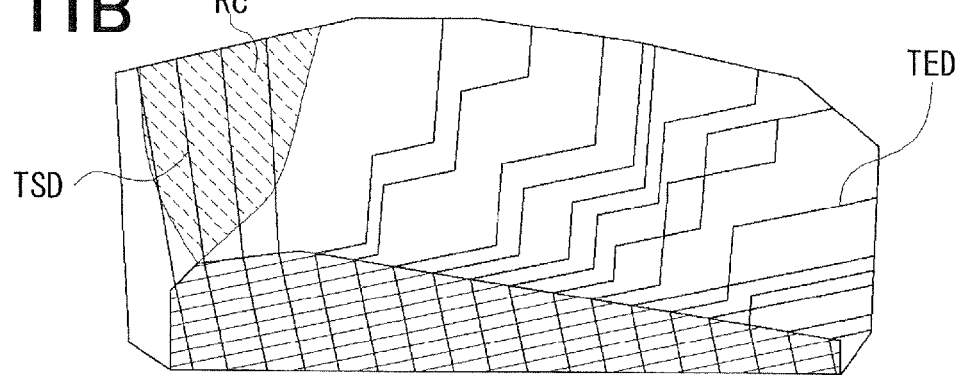
FIG. 11B is a cross-sectional view of a SiC single crystal grown with the SiC seed crystal shown in FIG. 11A.

Further, the SiC seed crystal 12$i$ has the inclined surfaces $X_2X_3$ and $X_3X_4$, which are disposed in such a manner that the uppermost portion $X_3$ of the {0001} plane is disposed at an inner side on the main growth surface. Therefore, as shown in FIG. 11B, in the SiC seed crystal 12$i$, the c-plane facet has a low potential of growing out of the high-density threading screw dislocation (TSD) region even though the crystal grows in a radial direction. As a result, the generation of the heterogeneous polymorphous crystals caused by the temporary decrease in the density of the threading screw dislocations can be inhibited.

4.10. Tenth Embodiment

Figure 12A:
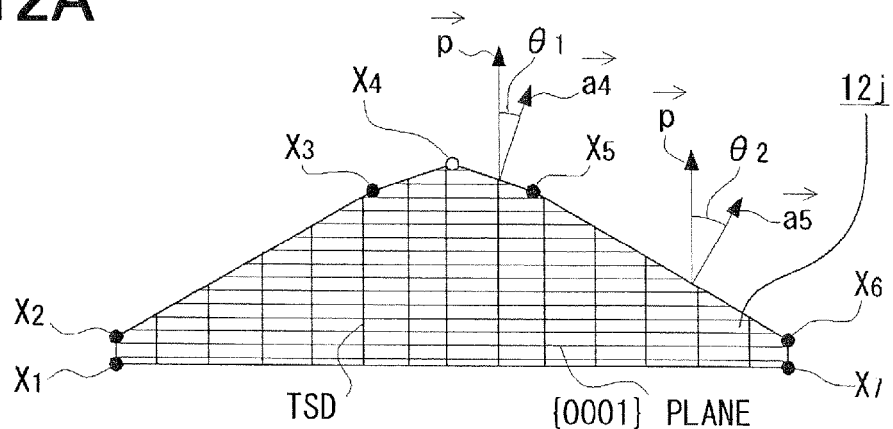
FIG. 12A is a cross-sectional view of a SiC seed crystal according to a tenth embodiment.

As shown in FIG. 12A, a SiC seed crystal 12$j$ has four inclined surfaces $X_2X_3$, $X_3X_4$, $X_4X_5$ and $X_5X_6$ at the raw material side. The surfaces $X_2X_3$, $X_3X_4$, $X_4X_5$ and $X_5X_6$ have different inclined angles. The SiC seed crystal 12$j$ is a so-called onset substrate in which the {0001} plane inclined angle σ=0. The uppermost portion $Y_1$ of the {0001} plane is a point $X_4$. A sub-growth surface $X_4X_5$ has an inclined angle $\phi_1$ that satisfies a relationship of $\phi_1=\theta_1$. A sub-growth surface $X_5X_6$ has an inclined angle $\phi_2$ that satisfies a relationship of $\phi_2=\theta_2$. The surfaces $X_2X_3$ and $X_3X_4$ are equivalent to the surfaces $X_4X_5$ and $X_5X_6$ respectively. Hereafter, the surfaces $X_4X_5$ and $X_5X_6$ are mainly used for description. However, the surfaces $X_2X_3$ and $X_3X_4$ are the same with the surfaces $X_4X_5$ and $X_5X_6$ respectively. A point $X_6$ is the most distant point on the periphery of the main growth surface from the point $X_4$ and is also the lowermost portion $Y_2$ of the {0001} plane.

A normal vector of a surface $X_1X_2$ and a normal vector of a surface $X_6X_7$ are perpendicular to the vector q. A surface $X_1X_7$ is in contact with the crucible 14 or the seed crystal pedestal 18. Thus, the main growth surface is composed of the surface $X_2X_3$, the surface $X_3X_4$, the surface $X_4X_5$ and the surface $X_5X_6$. The SiC seed crystal 12$j$ has a plurality of sub-growth surfaces in a direction (main direction) from the uppermost portion $X_4$ of the {0001} plane to the point $X_6$ on the periphery of the main growth surface. Among the sub-growth surfaces in the main direction, the sub-growth surface $X_4X_5$ includes the uppermost portion $Y_1$ of the {0001} plane and is the first sub-growth surface $F_1$. The second sub-growth surface $F_2$ is the surface $X_5X_6$ and $\theta_1<\theta_2$.

The SiC seed crystal 12$j$ has a predetermined amount of the threading screw dislocations. Therefore, the threading screw dislocation generation region is not formed on the surface $X_3X_4$ and on the surface $X_4X_5$.

Figure 12B:
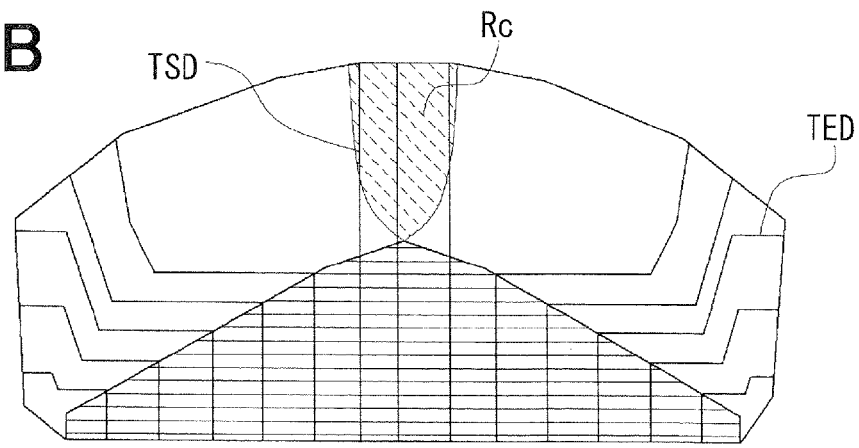
FIG. 12B is a cross-sectional view of a SiC single crystal grown with the SiC seed crystal shown in FIG. 12A.

The SiC seed crystal 12$j$ is an onset substrate in which the vector p and the vector q are in the same direction. As shown in FIG. 12B, when a SiC single crystal 12$j$ described above is used for growing a crystal, the threading screw dislocations (TSD) on the surfaces $X_3X_4$ and $X_4X_5$ are transferred to the growing crystal. Accordingly, the threading screw dislocations (TSD) are transferred to the c-plane facet and the generation of the heterogeneous polymorphous crystals is inhibited. Further, the offset angle $\theta_2$ of the second sub-growth surface $X_5X_6$ is set to a relatively large value. Therefore, the threading screw dislocations (TSD) in the seed crystal can be converted to the basal surface threading edge dislocations (TED), and can be removed to the exterior of the growing crystal.

4.11. Eleventh Embodiment

An example of a SIC seed crystal is shown in FIG. 13A, the main growth surface of the SiC seed crystal is composed of plane surfaces. In this example, both the low offset angle region (shown with the hatching) and the high offset angle region (shown without the hatching) are composed of three plane surfaces.

An example of a SiC seed crystal is shown in FIG. 13B, the main growth surface of the SiC seed crystal is also composed of plane surfaces. In this example, the low offset angle region (shown with the hatching) is composed of three plane surfaces, and the high offset angle region (shown without the hatching) is composed of six plane surfaces.

When the seed crystal is an onset substrate, the uppermost portion $Y_1$ of the {0001} plane is a portion shown by an open circle in FIG. 13A and FIG. 13B, and the lowermost portions $Y_2$ of the {0001} plane is portions shown by filled circles in FIG. 13A and FIG. 13B.

As shown in FIG. 13E, a seed crystal having a main growth surface composed of plane surfaces can be manufactured by a grinding process. The seed crystal rotates around a z-axis in a stepwise manner, and rotates around a x-axis or a y-axis in a stepwise manner while a surface of the seed crystal is being grinded by an abrasive wheel (AW).

The grinding process needs more time and work when the number of the plane surfaces, which compose the main growth surface, increases. However, a growth speed of the seed crystal can be maintained at a certain level by decreasing height differences among the portions on the periphery of the seed crystal.

An example of a SiC seed crystal is shown in FIG. 13C, the main growth surface of the SiC seed crystal is composed of curved surfaces. In this example, both the low offset angle region (shown with the hatching) and the high offset angle region (shown without the hatching) are composed of one curved surface.

An example of a SiC seed crystal is shown in FIG. 13D, the main growth surface of the SiC seed crystal is also composed of curved surfaces. In this example, the low offset angle region (shown with the hatching) and the high offset angle region (shown without the hatching) are integrated together without a clear boundary, and the whole main growth surface is composed of a curved surface.

When the seed crystal is an onset substrate, the uppermost portion $Y_1$ of the {0001} plane is a portion shown by an open circle in FIG. 13C and FIG. 13E, and the lowermost portions $Y_2$ of the {0001} plane is the whole periphery of the substrate (shown in a bold line in FIG. 13C and FIG. 13E).

As shown in FIG. 13F, a seed crystal having a main growth surface composed of a plurality of curved surfaces can be manufactured by a grinding process. The seed crystal rotates around the z-axis continuously, and rotates around the x-axis or the y-axis in a stepwise manner during a surface of the seed crystal is being grinded by the abrasive wheel (AW).

As shown in FIG. 13G, a seed crystal having a main growth surface composed of one curved surface can be manufactured by a grinding process. The seed crystal rotates around the z-axis continuously, and rotates around the x-axis or the y-axis continuously during a surface of the seed crystal is being grinded by the abrasive wheel (AW).

When the main growth surface is composed of curved surfaces, height differences among portions on the periphery of the seed crystal can be removed. However, a three-dimensional processing of the curved surfaces needs a complicated processing apparatus and needs a surface damage removing process (for example, etching process or sacrificial oxidation) to be performed. However, curved surface is an ideal shape to prevent a generation of the subgrain boundary.

In FIG. 13A to FIG. 13D, the seed crystals have circular shape. However, a seed crystal having rectangular shape also can be applied in above-described grinding process.

4.12. Twelfth Embodiment

Figure 14A:
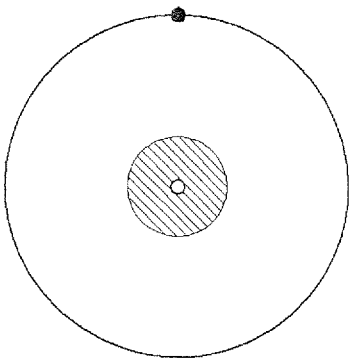
FIG. 14A to FIG. 14C are bottom views of various main growth surfaces of seed crystals according to a twelfth embodiment.
Figure 14B:
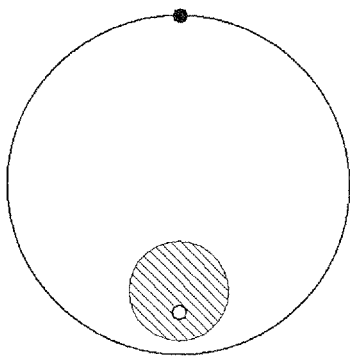
Figure 14C:
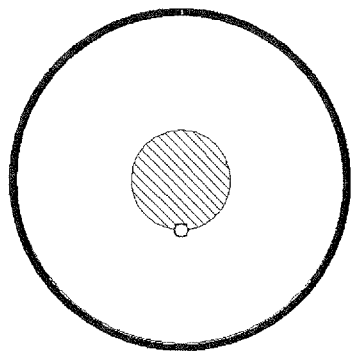

FIG. 14A to FIG. 14C are schematic views of the main growth surfaces. The main growth surfaces may be composed of planar surfaces or curved surfaces. The main growth surface can be processed by various processing methods (see FIG. 13A to FIG. 13D).

In a seed crystal shown in FIG. 14A, the low offset angle region (shown with the hatching) is at a center of the main growth surface. The uppermost portion $Y_1$ (shown by an open circle) of the {0001} plane is also at the center of the main growth surface. The lowermost portion $Y_2$ (shown by a filled circle) of the {0001} plane is at a portion on the periphery of the main growth surface. In a case where the {0001} plane inclined angle σ>0 and a central portion of the main growth surface has a convex shape, the seed crystal may have above-described structure as shown in FIG. 14A.

In a seed crystal shown in FIG. 14B, the low offset angle region (shown with the hatching) is at an outer side from a center of the main growth surface. The uppermost portion $Y_1$ (shown by an open circle) of the {0001} plane is at an outer side from a center of the low offset angle region. The lowermost portion $Y_2$ (shown by a filled circle) of the {0001} plane is at a portion on the periphery of the main growth surface. In a case where the {0001} plane inclined angle σ>0, the seed crystal may have above-described structure as shown in FIG. 14B.

In a seed crystal shown in FIG. 14C, the low offset angle region (shown with the hatching) is at a center of the main growth surface. The uppermost portion $Y_1$ (shown by an open circle) of the {0001} plane is at a portion on the periphery of the low offset angle region. The lowermost portion $Y_2$ (shown by a filled circle) of the {0001} plane covers the whole periphery (shown by a bold line) of the main growth surface. In a case where the seed crystal is an onset substrate, the low offset angle region is composed of one plane surface and is inclined from a plane perpendicular to the central axis, the seed crystal may have above-described structure as shown in FIG. 14C.

In any one of cases described above, the threading screw dislocations are transferred easily to the growing crystal in the low offset angle region other than the other region. Thus, the distribution generating of the threading screw dislocations and inhibiting effect of the heterogeneous polymorphous crystals can be achieved.

5. Effects of SiC Manufacturing Methods

As shown in FIG. 15A, a great amount of the threading screw dislocations 72 are introduced in a SiC single crystal 70 in a direction approximately parallel to the c-axis.

As shown in FIG. 15B, when a seed crystal 74a in which the a-plane is used as a growth surface, is cut from a SiC single crystal like the SiC single crystal 70, threading screw dislocations 72 are exposed on some parts of the growth surface.

As shown in FIG. 15C, when a seed crystal like the seed crystal 74a is used for growing SiC on the a-plane, a SiC single crystal 76a having little threading screw dislocations can be obtained. However, in the SiC single crystal 76a, a great amount of stacking faults 78, which are grown from such as the exposed threading screw dislocations 72a, and basal surface dislocations (end portions of the stacking faults and other kinds of basal surface dislocations (not shown)) are generated.

After the SiC single crystal 76a is grown, a seed crystal 74b is cut from the SiC single crystal 76a. In the seed crystal 74b, another a-plane, which is inclined 90° from the a-plane used as the growth surface in the previous growth step, is used as a growth surface. As shown in FIG. 15D, stacking faults 78 are exposed partially on the growth surface of the seed crystal 74b.

As shown in FIG. 15E, when a seed crystal like the seed crystal 74b is used for growing SiC on the a-plane, a SiC single crystal 76b having little threading screw dislocations can be obtained. Further, a density of the basal surface dislocations (end portions of the stacking faults and other kinds of basal surface dislocations (not shown)) is reduced compared with the SiC single crystal 76a grown in the previous growth step.

As shown in FIG. 15F, after the a-plane growth is repeated predetermined times, a seed crystal 74c is cut from the SiC single crystal 76b (or 76a). The seed crystal 74c has a growth surface, which has an offset angle against to the c-plane within a predetermined range. In this case, stacking faults 78 are exposed on the growth surface of the seed crystal 74c.

As shown in FIG. 15G, when a seed crystal like the seed crystal 74c is used for growing SiC on the c-plane, the stacking faults 78 exposed on the growth surface grow nearly parallel to the c-plane, and move to side surface of the growing SiC single crystal 76c. Then, a high-quality single crystal, which has a low density of the threading screw dislocations and a low density of stacking faults, can be grown.

However, the threading screw dislocations may also be generated in a case where the seed crystal 74c, which is cut from the SiC single crystal grown by repeated a-plane growth, is used. A considerable reason will be described below.

Figure 16A:
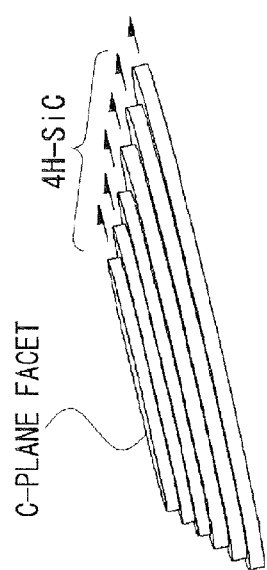
FIG. 16A to FIG. 16F are diagrams showing processes of a step flow growth of a SiC single crystal and processes of a heterogeneous polymorphous crystal growth.
Figure 16B:
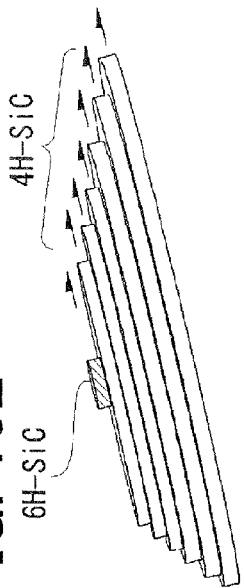
Figure 16C:
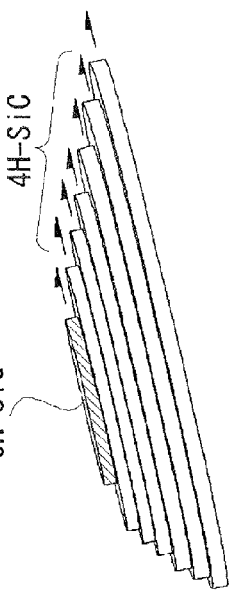

As shown in FIG. 16A to FIG. 16C, the threading screw dislocations (TSD) need to be provided in the c-plane facet, which is located at a forefront portion of the growing crystal. Because, the threading screw dislocations (TSD) transfer a polymorphism of the seed crystal (for example, 4H—SiC) in the growth direction.

Figure 16D:
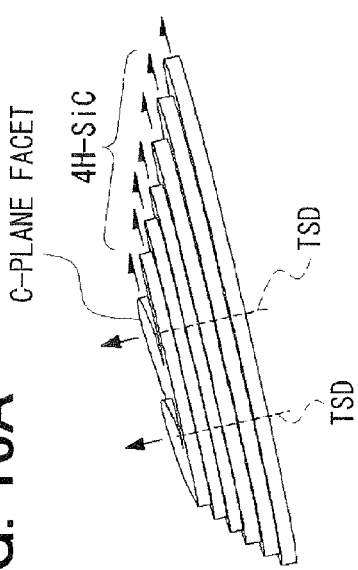
Figure 16E:
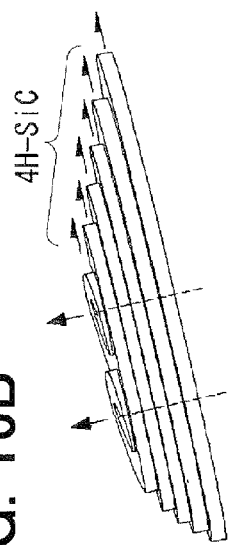
Figure 16F:
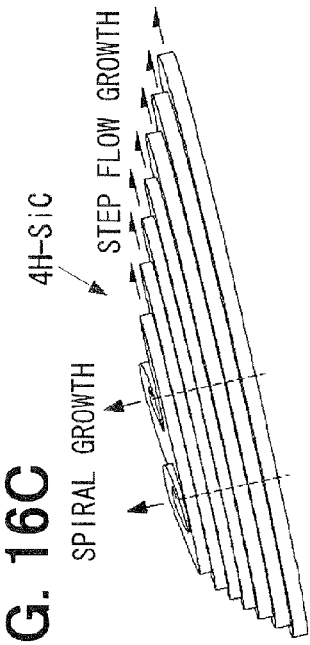

However, as shown in FIG. 16D to FIG. 16F, when high-quality seed crystals having no threading screw dislocations (TSD) are used, the c-plane facet has no threading screw dislocations (TSD), which provides growth sources. Thus, in many cases, the heterogeneous polymorphous crystals (for example, 6H—SiC) are generated in the growing crystals. When the heterogeneous polymorphous crystals are generated, a distortion between the newly generated heterogeneous polymorphous crystal and the 4H—SiC will be generated causing a generation of new threading screw dislocations. Accordingly, a quality of the growing crystal will be substantially degraded.

As described above, to inhibit a generation of the threading screw dislocations caused by the heterogeneous polymorphous crystals, a method is disclosed. In this method, the threading screw dislocation generation region is formed at the upstream side in the offset direction of the seed crystal prior to the c-plane growth and after the repeated a-plane growth. A crystal grown by this method has small amount of the heterogeneous polymorphous crystals and an extremely low density of dislocations compared with a crystal grown by a conventional method. However, when the threading screw dislocation generation region is formed in a seed crystal having a reduced density of the threading screw dislocations, the threading screw dislocations may leak from the threading screw dislocation generation region to a high-quality region of the growing crystal. It is because a part of defects and the threading screw dislocations in the threading screw dislocation generation region convert to the basal surface threading edge dislocations, and the basal surface threading edge dislocations leak to the high-quality region and convert to the threading screw dislocations again.

The basal surface threading edge dislocations leak to the high-quality region by a larger mount with an increasing offset angle. Thus, the leak of the basal surface threading edge dislocations (TED) can be inhibited by decreasing the offset angle.

However, when the offset angle is decreased, the facet enlarges with growth in a radial direction in the growing crystal. On the facet, the threading screw dislocations, which provide step supply sources, are not sufficiently provided on a part out of the threading screw dislocation generation region. Therefore, the heterogeneous polymorphous crystals are generated easily. When the threading screw dislocation generation region is enlarged, the generation of the heterogeneous polymorphous crystals will be inhibited, however, at the same time the high-quality region will be reduced.

In regard to above problems, when some offset angles of the main growth surface are changed, the leak of the threading screw dislocations and the leak of the basal surface threading edge dislocations can be inhibited. Further, a density distribution of the threading screw dislocations can be controlled.

That is, most of the exposed threading screw dislocations in the seed crystal on the first sub-growth surface $F_1$ and a region in the vicinity of the first sub-growth surface $F_1$ are transferred to the growing crystal when the offset angle $\theta_1$ of the first sub-growth surface $F_1$ is set to a relatively small value. As a result, the threading screw dislocations can be provided with certainty in a region formed by the first sub-growth surface $F_1$ and in a region in the vicinity of the c-plane facet, and the generation of the heterogeneous polymorphous crystals and the different surface orientation crystals can be inhibited in the growing crystal. Further, the leak of the threading screw dislocations and the leak of the basal surface threading edge dislocations can be inhibited almost-totally when the offset angle $\theta_1$ is set to a smaller value.

Meanwhile, the exposed threading screw dislocations in the seed crystal on the sub-growth surfaces $F_2$ to $F_n$ are transferred to the growing crystal at a low potential and are easily converted to the basal surface threading edge dislocations when the offset angles $\theta_2$ to $\theta_n$ of the sub-growth surfaces $F_2$ to $F_n$ are set to relatively large values. The basal surface threading edge dislocations easily move to the downstream side in the offset direction. Thus, a density of the threading screw dislocations in the seed crystal on the n-th sub-growth surface $F_n$ or on a sub-growth surface in the vicinity of the n-th sub-growth surface $F_n$ can be reduced. Further, a generation of new threading screw dislocations can be inhibited.

Example 1

1. Specimen Preparation 1.1. SiC Seed Crystal Preparation

A SiC single crystal, which has a low density of dislocations and little threading screw dislocations, is grown by performing the a-plane growth repeatedly. The SiC single crystal 12a shown in FIG. 3A is prepared from the above-described SiC single crystal. The offset angles $\theta_1$, $\theta_2$ and the area ratio $S_4/S_1$ of the threading screw dislocation generation region (the surface $X_2X_3$) are set to values below.

(1) $\theta_1=4°$, $\theta_2=15°$, $S_4/S_1=10\%$
(2) $\theta_1=4°$, $\theta_2=10°$, $S_4/S_1=20\%$
(3) $\theta_1=4°$, $\theta_2=8°$, $S_4/S_1=20\%$
(4) $\theta_1=2°$, $\theta_2=15°$, $S_4/S_1=10\%$
(5) $\theta_1=2°$, $\theta_2=6°$, $S_4/S_1=30\%$
(6) $\theta_1=2°$, $\theta_2=4°$, $S_4/S_1=30\%$ 1.2. SiC Single Crystal Preparation A SiC single crystal is grown using the SiC seed crystal obtained from the SiC seed crystal preparation step.

2. Result

The c-plane facet is maintained in the threading screw dislocation generation region and the heterogeneous polymorphous crystals are not generated because most of the offset angles on the main growth surface are set to large values. A dislocation behavior of a grown crystal sample, which is cut in cross section from the grown crystal, is examined by an X-ray topography method. From the result, it is found that the growing crystal has little threading screw dislocations at a lowermost portion side of the {0001} plane, because the leak of the basal surface threading edge dislocations from the threading screw dislocation generation region is inhibited.

Example 2

1. Specimen Preparation 1.1. SiC Seed Crystal Preparation

A SiC single crystal, which has a low density of dislocations and little threading screw dislocations, is grown by performing the a-plane growth repeatedly. The SiC single crystal 12e shown in FIG. 7A is prepared from the above-described SiC single crystal. The offset angles $\theta_1$, $\theta_2$ and the area ratio $S_4/S_1$ of the threading screw dislocation generation region (the surfaces $X_3X_4$ and $X_4X_5$) are set to values below.

(1) $\theta_1=4°$, $\theta_2=15°$, $S_4/S_1=10\%$
(2) $\theta_1=4°$, $\theta_2=10°$, $S_4/S_1=20\%$
(3) $\theta_1=4°$, $\theta_2=8°$, $S_4/S_1=20\%$ 1.2. SiC Single Crystal Preparation A SiC single crystal is grown using the SiC seed crystal obtained from the SiC seed crystal preparation step.

2. Result

The c-plane facet is maintained in the threading screw dislocation generation region and the heterogeneous polymorphous crystals are not generated because most of the offset angles on the main growth surface are set to large values. A dislocation behavior of a grown crystal sample, which is cut in cross section from the grown crystal, is examined by the X-ray topography method. From the result, it is found that the growing crystal has little threading screw dislocations at the lowermost portion side of the {0001} plane, because the leak of the basal surface threading edge dislocations from the threading screw dislocation generation region is inhibited.

Example 3

1. Specimen Preparation 1.1. SiC Seed Crystal Preparation

The SiC seed crystal 12f shown in FIG. 8A is prepared from a SiC single crystal, which has a density $n_s$ of the threading screw dislocations approximately $10/\text{cm}^2$ or approximately $100/\text{cm}^2$ or approximately $1000/\text{cm}^2$. The offset angles $\theta_1$, $\theta_2$ and the area ratio $S_3/S_1$ of the low offset angle region (the surface $X_2X_3$) are set to values below.

(1) $n_s=1000/\text{cm}^2$, $\theta_1=20°$, $\theta_2=50°$, $S_3/S_1=5\%$
(2) $n_s=1000/\text{cm}^2$, $\theta_1=20°$, $\theta_2=40°$, $S_3/S_1=5\%$
(3) $n_s=1000/\text{cm}^2$, $\theta_1=20°$, $\theta_2=30°$, $S_3/S_1=10\%$
(4) $n_s=100/\text{cm}^2$, $\theta_1=10°$, $\theta_2=30°$, $S_3/S_1=10\%$
(5) $n_s=100/\text{cm}^2$, $\theta_1=10°$, $\Theta_2=20°$, $S_3/S_1=10\%$
(6) $n_s=100/\text{cm}^2$, $\theta_1=8°$, $\theta_2=30°$, $S_3/S_1=10\%$
(7) $n_s=100/\text{cm}^2$, $\theta_1=8°$, $\theta_2=12°$, $S_3/S_1=10\%$
(8) $n_s=10/\text{cm}^2$, $\theta_1=4°$, $\theta_2=20°$, $S_3/S_1=10\%$
(9) $n_s=10/\text{cm}^2$, $\theta_1=4°$, $\Theta_2=8°$, $S_3/S_1=20\%$
(10) $n_s=10/\text{cm}^2$, $\theta_1=2°$, $\theta_2=20°$, $S_3/S_1=10\%$
(11) $n_s=10/\text{cm}^2$, $\theta_1=2°$, $\theta_2=8°$, $S_3/S_1=20\%$ 1.2. SiC Single Crystal Preparation A SiC single crystal is grown using the SiC seed crystal obtained from the SiC seed crystal preparation step.

2. Result

The c-plane facet is maintained in the low offset angle region and a generation of the heterogeneous polymorphous crystals is inhibited during the growth. A dislocation behavior of a grown crystal sample, which is cut in cross section from the grown crystal, is examined by the X-ray topography method. From the result, it is found that a part of the threading screw dislocations located at the high offset angle region side are converted to the basal surface threading edge dislocations located at the downstream side in the offset direction at a predetermined conversion ratio, and removed to the exterior of the growing crystal. The predetermined conversion ratio increased with an increasing offset angle in the high offset angle region.

In the low offset angle region, a conversion ratio from the threading screw dislocations to the threading edge dislocations is much lower than the conversion ratio in the high offset angle region. The threading screw dislocations in the low offset angle region can be reduced more effectively by setting the offset angle according to a measured density of the threading screw dislocations. The measured density of the threading screw dislocations is measured after each growth step.

Example 4

1. Specimen Preparation 1.1. SiC Seed Crystal Preparation

The SiC seed crystal 12j shown in FIG. 12A is prepared from a SiC single crystal, which has a density $n_s$ of the threading screw dislocations approximately $10/\text{cm}^2$ or approximately $100/\text{cm}^2$ or approximately $1000/\text{cm}^2$. The offset angles $\theta_1$, $\theta_2$ and the area ratio $S_3/S_1$ of the low offset angle region (the surfaces $X_3X_4$, $X_4X_5$) are set to values below.

(1) $n_s=1000/\text{cm}^2$, $\theta_1=20°$, $\theta_2=40°$, $S_3/S_1=5\%$
(2) $n_s=100/\text{cm}^2$, $\theta_1=10°$, $\theta_2=20°$, $S_3/S_1=10\%$
(3) $n_s=10/\text{cm}^2$, $\theta_1=4°$, $\theta_2=20°$, $S_3/S_1=10\%$
(4) $n_s=10/\text{cm}^2$, $\theta_1=2°$, $\theta_2=20°$, $S_3/S_1=10\%$ 1.2. SiC Single Crystal Preparation A SiC single crystal is grown using the SiC seed crystal obtained from the SiC seed crystal preparation step.

2. Result

The c-plane facet is maintained in the low offset angle region and a generation of the heterogeneous polymorphous crystals is inhibited during the growth. A dislocation behavior of a grown crystal sample, which is cut in cross section from the grown crystal, is examined by the X-ray topography method. From the result, it is found that a part of the threading screw dislocations located at the high offset angle region side are converted to the basal surface threading edge dislocations located at the downstream side in the offset direction at a predetermined conversion ratio, and removed to the exterior of the growing crystal. The predetermined conversion ratio increased with an increasing offset angle in the high offset angle region.

In the low offset angle region, a conversion ratio from the threading screw dislocations to the threading edge dislocations is much lower than the conversion ratio in the high offset angle region. Thus, it is considered that a generation of the heterogeneous polymorphous crystals is inhibited by the much lower conversion ratio from the threading screw dislocations to the threading edge dislocations.

Comparison Example 1

1. Specimen Preparation 1.1. SiC Seed Crystal Preparation

A SiC single crystal, which has a low density of dislocations and little threading screw dislocations, is grown by performing the a-plane growth repeatedly. A SiC seed crystal having an offset angle θ of 8° is prepared from the SiC single crystal, and the threading screw dislocation generation region is formed on a region, which covers 20% of the growth surface.

1.2. SiC Single Crystal Preparation

A SiC single crystal is grown using the SiC seed crystal obtained from the SiC seed crystal preparation step.

2. Result

The c-plane facet is maintained in the threading screw dislocation generation region and the heterogeneous polymorphous crystals are not generated because most of the offset angles on the main growth surface are set to large values. A dislocation behavior of a grown crystal sample, which is cut in cross section from the grown crystal, is examined by the X-ray topography method. From the result, it is found that some of the basal surface threading edge dislocations are leaked from the threading screw dislocation generation region to the lowermost portion side of the {0001} plane, and are converted again to the threading screw dislocations.

Comparison Example 2

1. Specimen Preparation

1.1. SiC Seed Crystal Preparation

A SiC seed crystal having an offset angle of 30° is prepared from a SiC single crystal, which has a density $n_s$ of the threading screw dislocations 100/cm².

1.2. SiC Single Crystal Preparation

A SIC single crystal is grown using the SiC seed crystal obtained from the SiC seed crystal preparation step.

2. Result

The c-plane facet is maintained in the threading screw dislocation generation region because most of the offset angles on the main growth surface are set to large values. However, the heterogeneous polymorphous crystals may be generated. When the heterogeneous polymorphous crystals are generated, large amount of micropipe defects are observed on the growth surface of the growing crystal. A dislocation behavior of a grown crystal sample, which is cut in cross section from the grown crystal, is examined by the X-ray topography method. From the result, it is found that a part of the threading screw dislocations located in the seed crystal are converted to the basal surface threading edge dislocations at a predetermined conversion ratio. A region at the upstream side in the offset direction has a locally-low density of the threading screw dislocations, and the heterogeneous polymorphous crystals are originally generated from the region.

While the invention has been described with reference to preferred embodiments thereof, it is to be understood that the invention is not limited to the preferred embodiments and constructions. The invention is intended to cover various modification and equivalent arrangements.

Further, the manufacturing method of a SiC single crystal disclosed in the present invention may also be used as a manufacturing method of a SiC single crystal, which is used as a semiconductor material of an ultra-low power loss device.

What is claimed is:

1. A manufacturing method of a SiC single crystal comprising
   growing a SiC single crystal on a surface of a SiC seed crystal,
   wherein the SiC seed crystal satisfies following conditions (i) to (iii):
   (i) the SiC seed crystal includes a main growth surface composed of a plurality of sub-growth surfaces and the main grown surface is an exposed surface of the SiC single crystal whose normal vector has a component in a crucible central axis raw material direction;
   (ii) among directions from an uppermost portion of a {0001} plane on the main growth surface to portions on a periphery of the main growth surface, the SiC seed crystal has a main direction in which a plurality of sub-growth surfaces is arranged; and
   (iii) in a case where the sub-growth surfaces located from the uppermost portion of the {0001} plane to the periphery in the main direction are defined in order as a first sub-growth surface, a second sub-growth surface, ... an n-th sub-growth surface (n≥2), an offset angle $\theta_k$ of a k-th sub-growth surface (1≤k≤n−1) and an offset angle $\theta_{k+1}$ of a (k+1)-th sub-growth surface satisfy a relationship of $\theta_k < \theta_{k+1}$, and
   wherein an offset angle $\theta_1$ of the first sub-growth surface is 10° or less.

2. The manufacturing method according to claim 1, wherein the main direction is a direction in which a distance from the uppermost portion of the {0001} plane to the portion on the periphery of the main growth surface is largest.

3. The manufacturing method according to claim 1, wherein the main direction is a direction from the uppermost portion of the {0001} plane to a lowermost portion of the {0001} plane.

4. The manufacturing method according to claim 1, wherein an offset angle $\theta_n$ of the n-th sub-growth surface is 20° or greater and 70° or less.

5. The manufacturing method according to claim 1, wherein when an inclined angle σ of the {0001} plane is defined as an angle between a vector in the crucible central axis raw material direction and a normal vector of the {0001} plane, the inclined angle σ of the {0001} plane is 30° or less.

6. The manufacturing method according to claim 1, wherein when a projected area is defined as an area of a projected plane of the main growth surface or any one of the sub-growth surfaces on a plane perpendicular to the crucible central axis raw material direction and an inclined angle α of a sub-growth surface is defined as an angle between the vector in the crucible central axis raw material direction and a normal vector of any one of the sub-growth surfaces, a ratio (=$S_2 \times 100/S_1$) of a summation ($S_2$) of projected areas of the sub-growth surfaces having inclined angles σ of 30° or less to a projected area $S_1$ of the main growth surface is 50% or greater.

7. The manufacturing method according to claim 1, wherein when a projected area is defined as an area of a projected plane of the main growth surface or any one of the sub-growth surfaces on the plane perpendicular to the crucible central axis raw material direction, a ratio (=$S_3 \times 100/S_1$) of a summation ($S_3$) of projected areas of the sub-growth surfaces having offset angles θ of 20° or less to the projected area $S_1$ of the main growth surface is 50% or less.

8. The manufacturing method according to claim 1, wherein the main growth surface includes a finite number of planar sub-growth surfaces.

9. The manufacturing method according to claim 1, wherein a difference between the offset angle $θ_1$ of the first sub-growth surface and the offset angle $θ_n$ of the n-th sub-growth surface is 2° or greater.

10. The manufacturing method according to claim 1, wherein a difference between the offset angle $θ_k$ of the k-th sub-growth surface and an offset angle $θ_{k-1}$ of a (k−1)-th sub-growth surface is 30° or less.

11. The manufacturing method according to claim 1, wherein a threading screw dislocation generation region is formed on a region of the main growth surface having an offset angle of 20° or less, and
wherein the threading screw dislocation generation region is capable of generating threading screw dislocations at a higher density than a threading screw dislocation density in the SiC seed crystal.

12. The manufacturing method according to claim 11, wherein the projected area is defined as the area of a projected plane of the main growth surface or any one of the sub-growth surfaces on the plane perpendicular to the crucible central axis raw material direction, and
wherein a ratio $(=S_4×100/S_1)$ of a projected area of the threading screw dislocation generation region to the projected area $S_1$ of the main growth surface is 50% or less.

13. The manufacturing method according to claim 11, wherein the threading screw dislocation generation region is formed on a region of the main growth surface having an offset angle of 4° or less.

14. The manufacturing method according to claim 11, wherein the SiC seed crystal is cut from a SiC single crystal that is grown on a seed crystal cut in such a manner that an offset angle of a growth surface is within a range of 60° to 90°.

15. The manufacturing method according to claim 14, wherein the offset angle $θ_n$ of the n-th sub-growth surface of the SiC seed crystal is 4° or greater and 30° or less.

16. The manufacturing method according to claim 1, further comprising
repeating the steps of cutting out a SiC seed crystal that satisfies the conditions described in claim 1 from the grown SiC single crystal and re-growing a SiC single crystal using the cut-out SiC seed crystal at least one time.

17. The manufacturing method according to claim 16, wherein an offset angle $θ(m)_n$ of an n-th sub-growth surface of the SiC seed crystal used in an m-th re-growth step is smaller than an offset angle $θ(m-1)_n$ of the n-th sub-growth surface of the SiC seed crystal used in an (m−1)-th re-growth step.

18. The manufacturing method according to claim 16, wherein an angle difference between an offset direction of a first sub-growth surface in the m-th re-growth step and an offset direction of the n-th sub-growth surface in the (m−1)-th re-growth step is within a range of 45° to 135° on the {0001} plane.

* * * * *